(12) United States Patent
Peluso et al.

(10) Patent No.: US 12,381,035 B2
(45) Date of Patent: Aug. 5, 2025

(54) MAGNETIC STRUCTURES AND INDUCTIVE COUPLING CONTROL

(71) Applicant: Infineon Technologies Austria AG, Villach (AT)

(72) Inventors: Luca Peluso, Villach (AT); Matthias J. Kasper, Villach (AT); Kenneth K. Leong, Villach (AT); Gerald Deboy, Klagenfurt (AT)

(73) Assignee: Infineon Technologies Austria AG, Villach (AT)

( * ) Notice: Subject to any disclaimer, the term of this patent is extended or adjusted under 35 U.S.C. 154(b) by 1067 days.

(21) Appl. No.: 17/318,161

(22) Filed: May 12, 2021

(65) Prior Publication Data

US 2022/0367109 A1    Nov. 17, 2022

(51) Int. Cl.
| | | |
|---|---|---|
| H01F 30/06 | (2006.01) | |
| H01F 27/24 | (2006.01) | |
| H01F 41/04 | (2006.01) | |
| H05K 1/18 | (2006.01) | |

(52) U.S. Cl.
CPC ............ *H01F 30/06* (2013.01); *H01F 27/24* (2013.01); *H01F 41/04* (2013.01); *H01F 41/046* (2013.01); *H05K 1/181* (2013.01); *H05K 2201/086* (2013.01)

(58) Field of Classification Search
CPC ................................ H01F 30/06; H01F 27/24
USPC ........................................................ 336/233
See application file for complete search history.

(56) References Cited

U.S. PATENT DOCUMENTS

| | | | | |
|---|---|---|---|---|
| 7,292,128 B2 * | 11/2007 | Hanley | .................... | H01F 17/06 |
| | | | | 336/178 |
| 10,973,127 B2 * | 4/2021 | Xiong | .................... | H02M 3/158 |
| 11,166,373 B2 * | 11/2021 | Xiong | .................. | H05K 1/0204 |
| 11,317,545 B1 * | 4/2022 | Perera | .................... | H02M 3/003 |
| 11,361,897 B2 * | 6/2022 | Yan | .......................... | H01F 27/29 |
| 2018/0122562 A1 * | 5/2018 | Ji | ............................ | H05K 1/181 |
| 2018/0323702 A1 * | 11/2018 | Zhou | ....................... | H01F 37/00 |
| 2020/0111597 A1 | 4/2020 | Xiong et al. | | |

(Continued)

FOREIGN PATENT DOCUMENTS

| | | | | | |
|---|---|---|---|---|---|
| CN | 114097051 A | * | 2/2022 | ............ | H01F 17/043 |
| EP | 4092694 A1 | * | 11/2022 | ............. | H01F 17/04 |
| JP | 2016154176 A | * | 8/2016 | | |

OTHER PUBLICATIONS

EP Extended Search Report, EP 22 17 2753, Oct. 25, 2022, pp. 1-10.

*Primary Examiner* — Shawki S Ismail
*Assistant Examiner* — Joselito S. Baisa
(74) *Attorney, Agent, or Firm* — Armis IP Law, LLC

(57) ABSTRACT

According to one configuration, a fabricator fabricates a core of a circuit component to include magnetic permeable material. The fabricator further produces the circuit component to include multiple electrically conductive paths extending through the core of the magnetic permeable material. In one arrangement, the multiple electrically conductive paths include a first electrically conductive path and a second electrically conductive path. The fabricator fabricates the circuit component and, more specifically, the core of the magnetic permeable material to include at least one cutaway portion operative to reduce inductive coupling between the first electrically conductive path and the second electrically conductive path disposed in the core.

26 Claims, 18 Drawing Sheets

(56) References Cited

U.S. PATENT DOCUMENTS

2020/0113059 A1\* 4/2020 Xiong ................ G06F 1/183
2020/0304036 A1\* 9/2020 Xiong ................ H05K 3/403
2020/0305285 A1   9/2020 Xiong et al.
2022/0013276 A1\* 1/2022 Clavette ............. H01F 17/06
2022/0172881 A1\* 6/2022 Xiong ................ H05K 1/145

\* cited by examiner

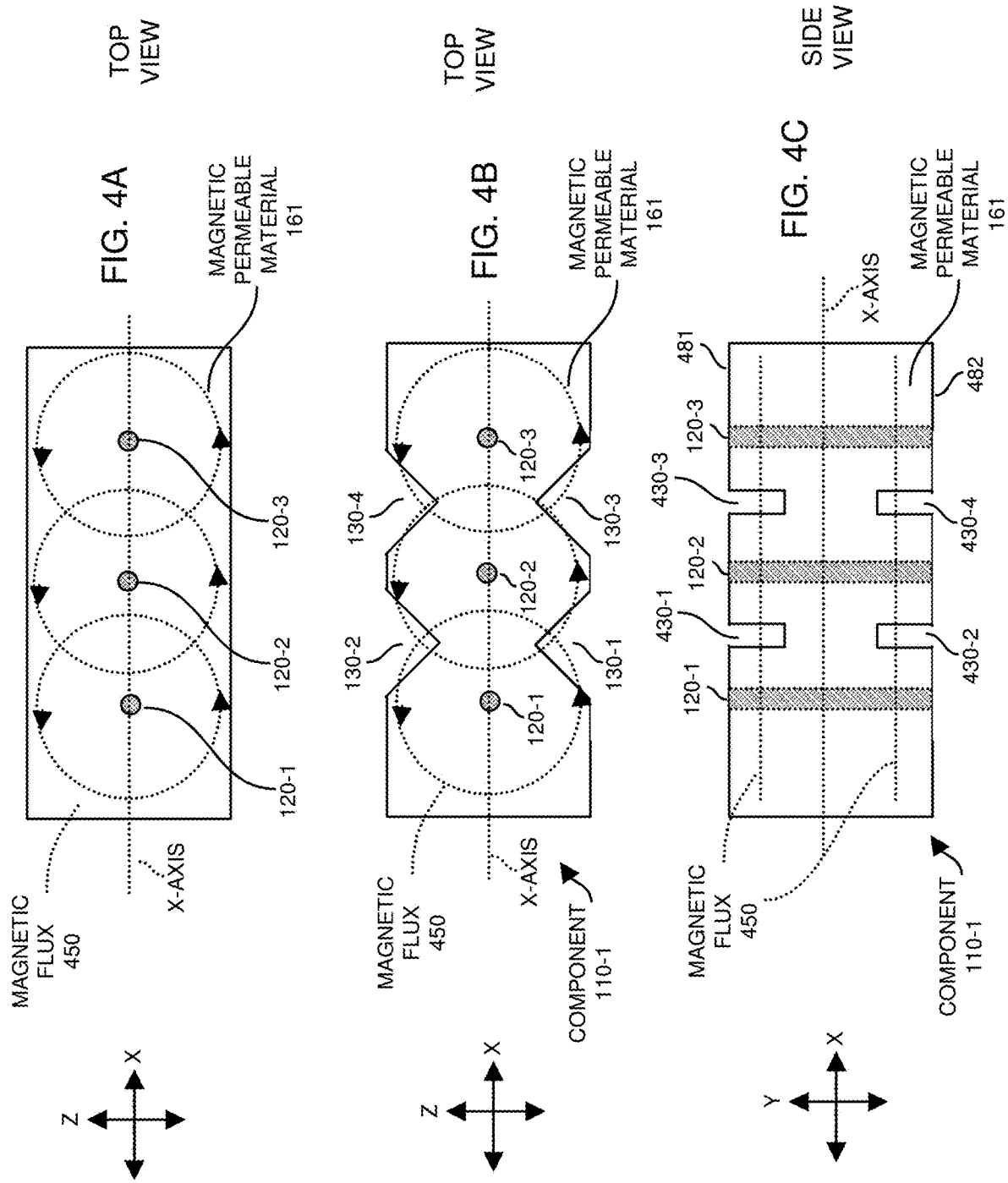

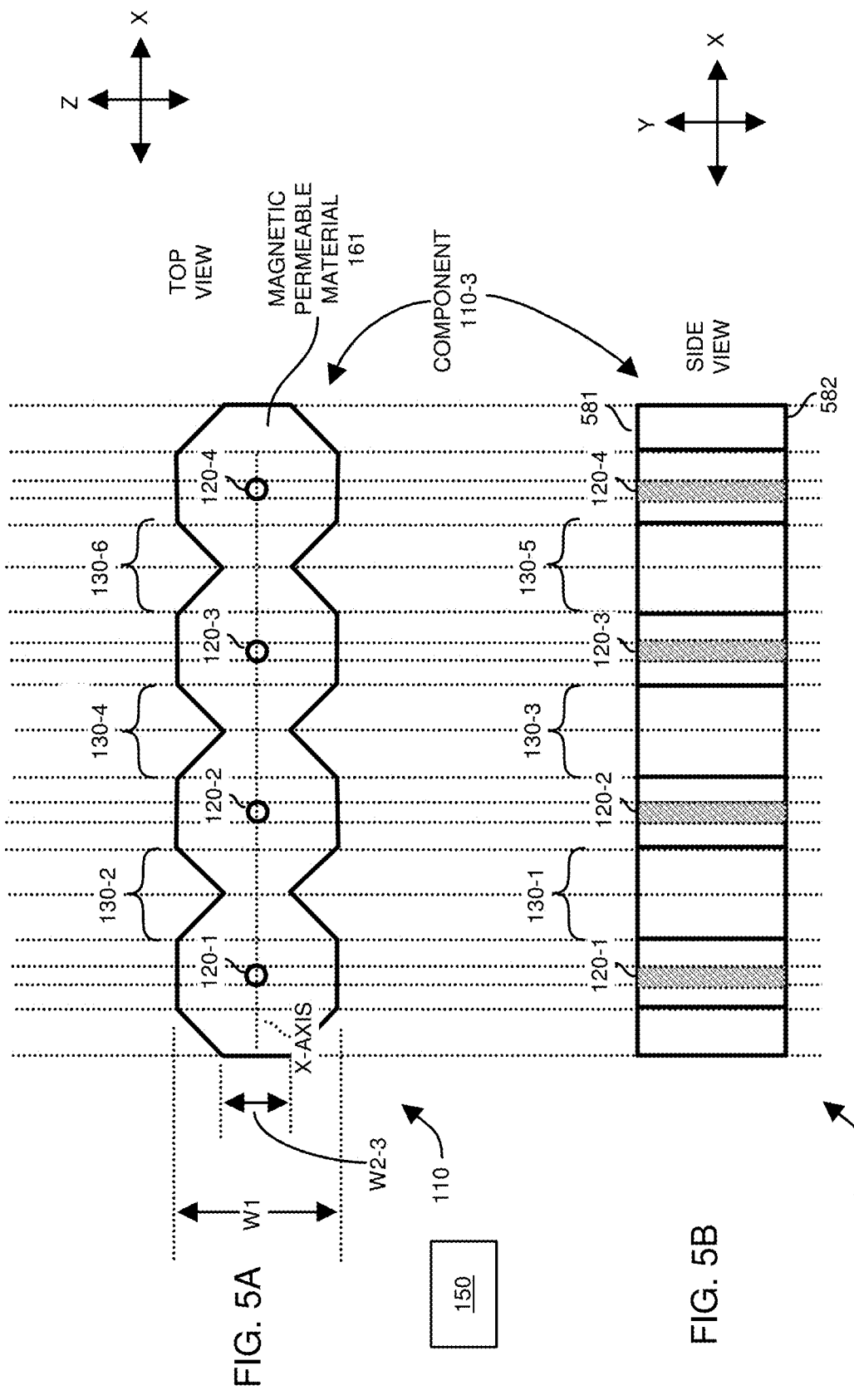

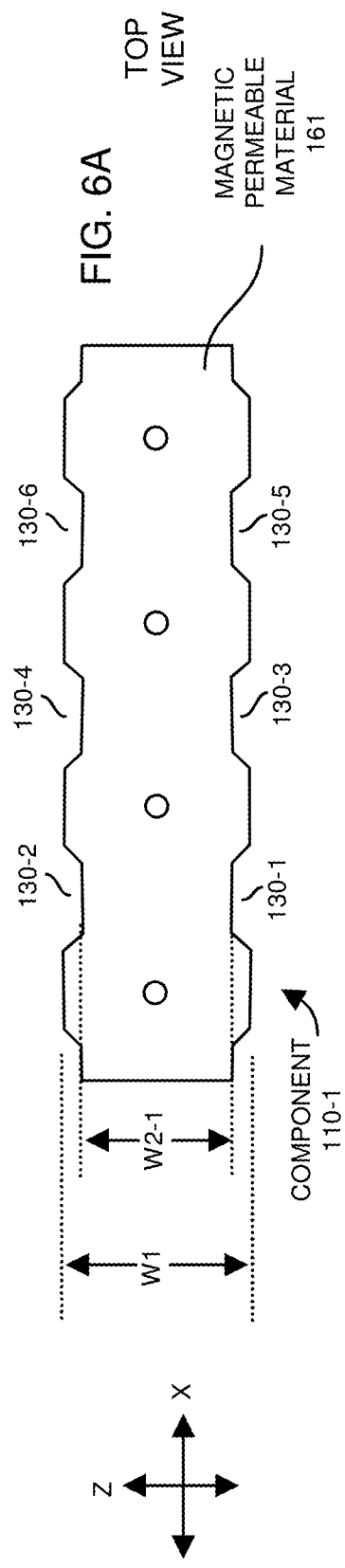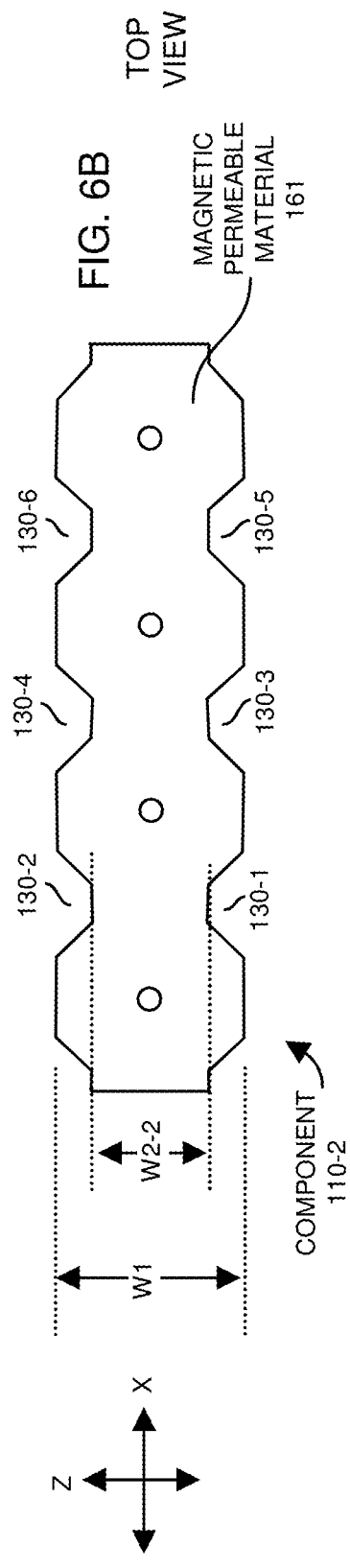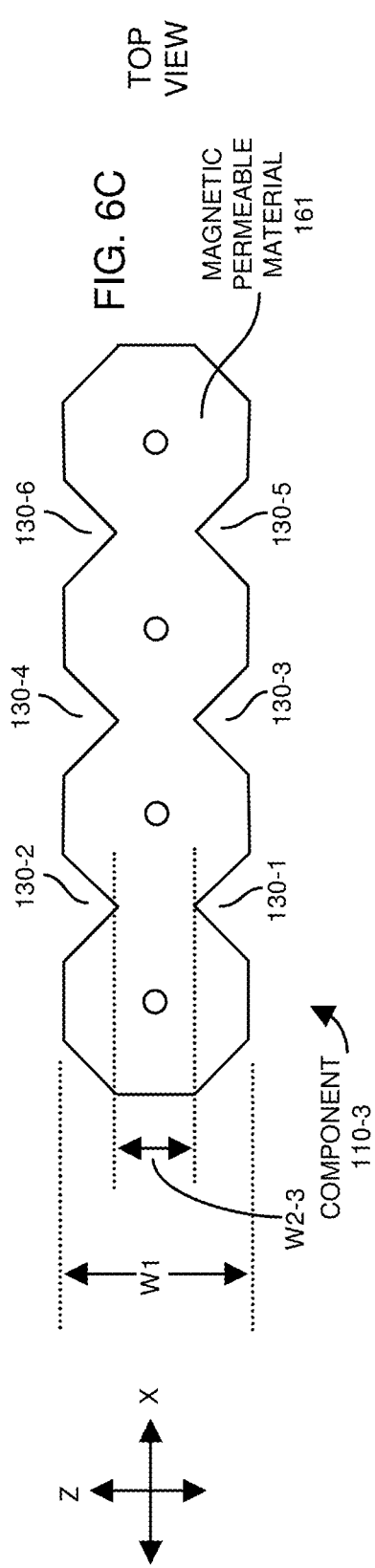

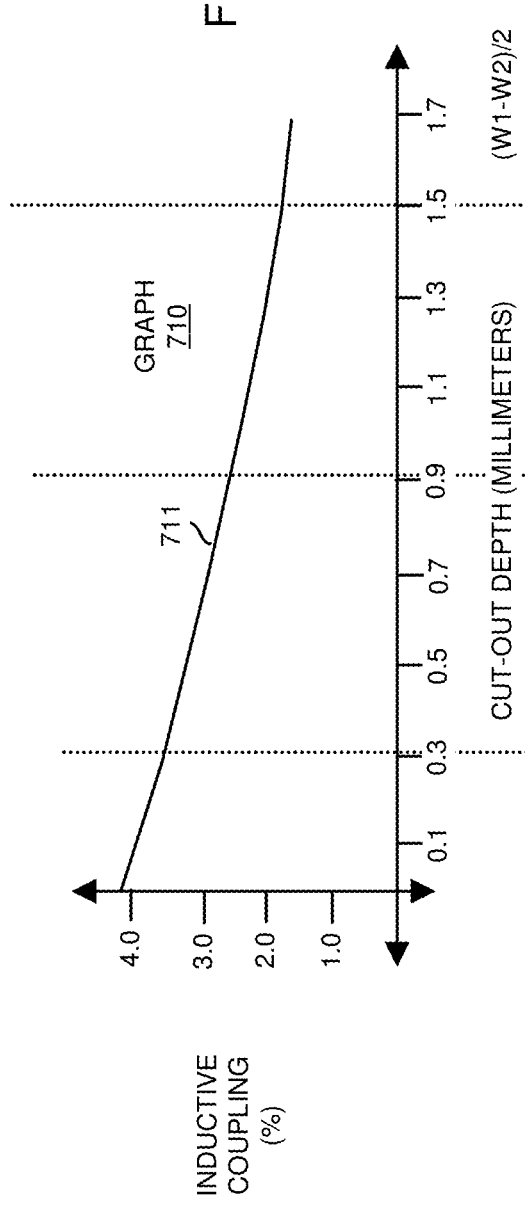
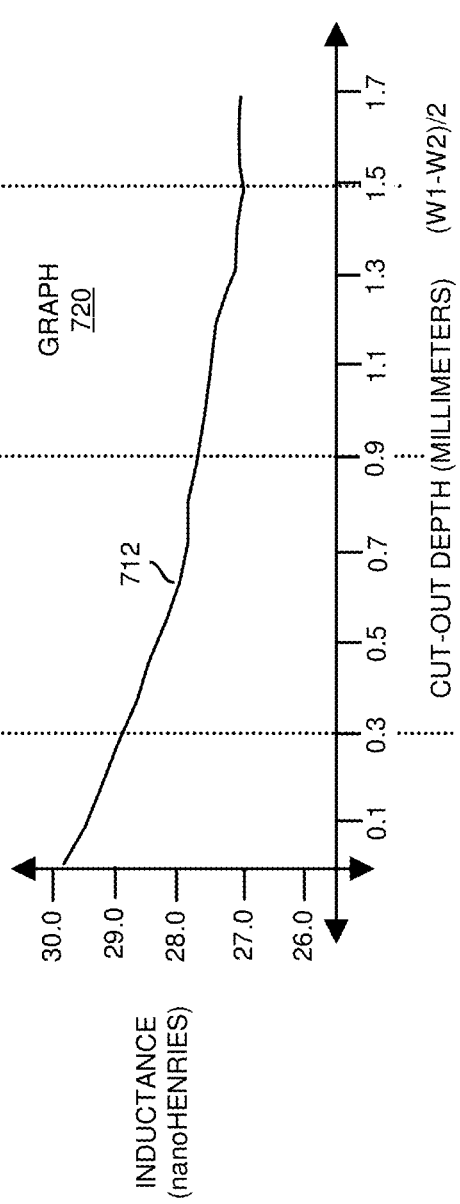
FIG. 7A
FIG. 7B

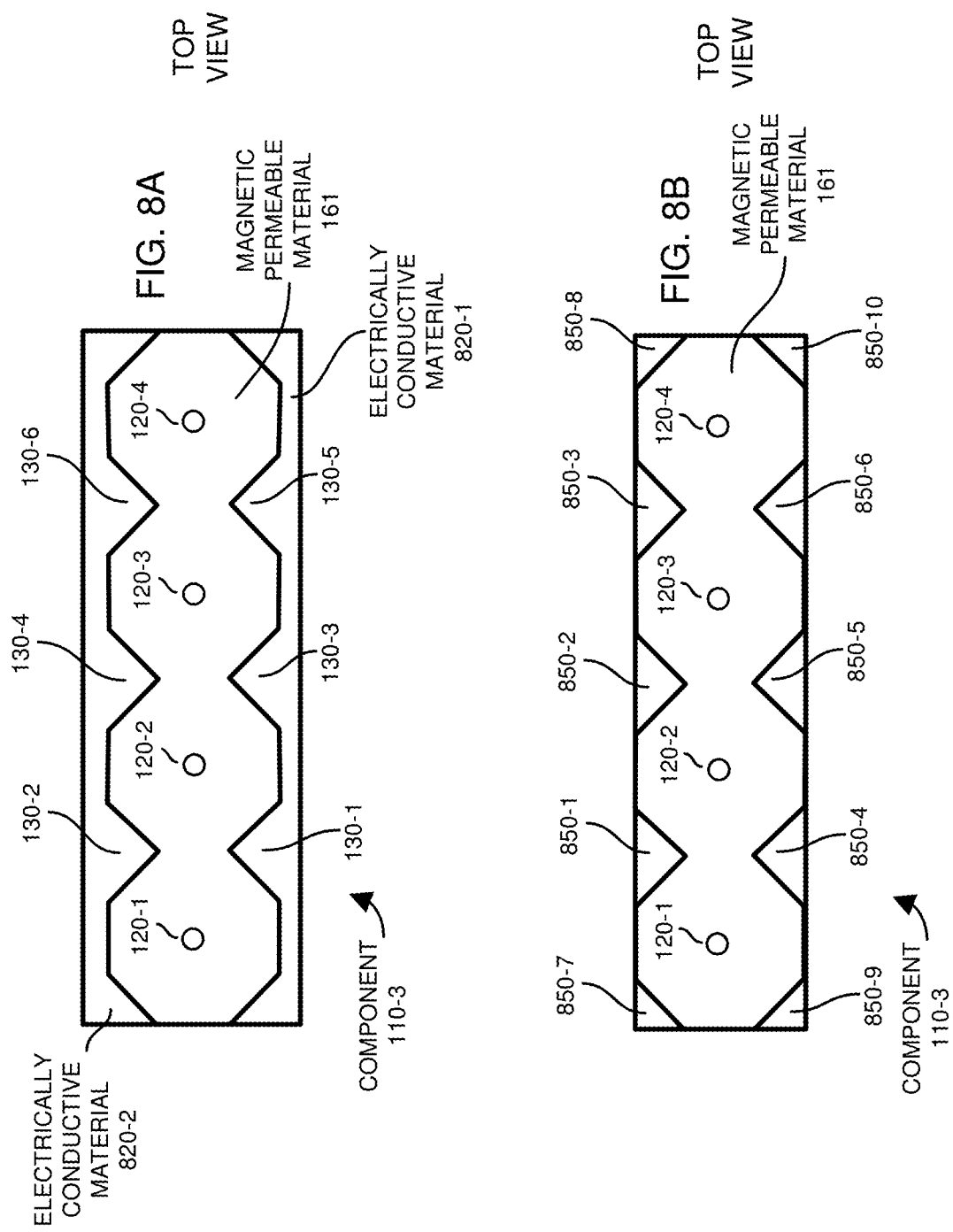

MAGNETIC STRUCTURES AND INDUCTIVE COUPLING CONTROL

BACKGROUND

Conventional switching power supply circuits sometimes include an energy storage component such as an inductor to produce an output voltage that powers a load. For example, to maintain a magnitude of an output voltage within a desired range, a controller controls switching of input current through one or more inductors.

In general, a conventional inductor is a component comprising wire or other conductive material, which is shaped as a coil or helix to increase an amount of magnetic flux through a respective circuit path. Winding of a wire into a coil of multiple turns increases the number of respective magnetic flux lines in a respective inductor component, increasing the magnetic field and thus overall inductance of the respective inductor component.

BRIEF DESCRIPTION

Implementation of clean energy (or green technology) is very important to reduce our impact as humans on the environment. In general, clean energy includes any evolving methods and materials to reduce an overall toxicity on the environment from energy consumption.

This disclosure includes the observation that raw energy, such as received from green energy sources or non-green energy sources, typically needs to be converted into an appropriate form (such as desired AC voltage, DC voltage, etc.) before it can be used to power end devices such as servers, computers, mobile communication devices, wireless base stations, etc. In certain instances, energy is stored in a respective one or more battery resource. Regardless of whether energy is received from green energy sources or non-green energy sources, it is desirable to make most efficient use of raw energy (such as storage and subsequent distribution) provided by such systems to reduce our impact on the environment. This disclosure contributes to reducing our carbon footprint and better use of energy via more efficient energy conversion.

For example, this disclosure includes the observation that conventional wire wound inductor components (such as used to support power conversion) are typically bulky and therefore undesirable to implement in certain applications. Such conventional devices inevitably make it difficult to create a compact, efficient, and high current output power supply circuit.

Embodiments herein provide novel and improved inductor components for use in applications such as power conversion. For example, embodiments herein include novel inductor devices, corresponding use, methods fabricating same, etc.

More specifically, embodiments herein include fabrication of an apparatus such as a circuit component. In one example embodiment, a fabricator fabricates a core of a circuit component to include magnetic permeable material. The fabricator further produces the circuit component to include multiple electrically conductive paths (inductive paths) extending through the core of the magnetic permeable material such as from one surface of the circuit component to another. Presence of the magnetic permeable material surrounding the electrically conductive paths results in the first electrically conductive path being a first inductive path in the circuit component and the second electrically conductive path being a second inductive path in the circuit component.

In one embodiment, the multiple electrically conductive paths include a first electrically conductive path and a second electrically conductive path. The fabricator fabricates the circuit component and, more specifically, the core of the magnetic permeable material to include one or more cutaway portions (a.k.a., cutout portions). Presence of the cutaway portions at respective appropriate one or more locations of the circuit component reduces inductive coupling between the first electrically conductive path and the second electrically conductive path disposed in the core. A degree of reduced inductor coupling between the first electrically conductive path and the second electrically conductive path is dependent on a size of the at least one cutaway portion. For example, in one embodiment, the large the cutaway portion, the less inductive coupling between the first electrically conductive path and the second electrically conductive path.

In accordance with further example embodiments, via the fabricator, the one or more cutaway portions of the magnetic permeable material includes a first cutaway portion and a second cutaway portion. The magnetic permeable material is absent from both the first cutaway portion and the second cutaway portion, reducing an inductive coupling coefficient between the first electrically conductive path and the second electrically conductive path.

In still further example embodiments, in addition to the one or more cutaway portions, the fabricator produces the circuit component to include a portion (such as a continuum without breaks in material) of magnetic permeable material between the first electrically conductive path and the second electrically conductive path. Additionally, or alternatively, further embodiments herein include, via the fabricator, disposing a portion (such as a continuum without breaks in material) of magnetic permeable material between the first cutaway portion and the second cutaway portion.

Yet further example embodiments herein include, via the fabricator, disposing the first electrically conductive path and the second electrically conductive path in parallel to each other such that the first electrically conductive path and the second electrically conductive path extend from a first surface of the circuit component to a second surface of the circuit component, the second surface being disposed opposite the first surface.

In still further example embodiments, the fabricator fabricates the circuit component to include a first cutaway portion and a second cutaway portion in which the magnetic permeable material is absent from both the first cutaway portion and the second cutaway portion. As previously discussed, absence of the magnetic permeable material at one or more locations of the circuit component reduces flow of mutual magnetic flux and thus inductive coupling between the first electrically conductive path and the second electrically conductive path.

In further example embodiments, the fabricator fabricates the at least one cutaway portion in the circuit component to include a first cutaway portion. In one embodiment, the first cutaway portion is disposed in both a flux path associated with flow of first current through the first electrically conductive path and flow of second current through the second electrically conductive path.

Still further example embodiments herein include, via the fabricator, fabricating the at least one cutaway portion to include a first cutaway portion. In one embodiment, the first cutaway portion is occupied by (such as filled with) first electrically conductive material. The fabricator fabricates the at least one cutaway portion to further include a second cutaway portion; the second cutaway portion is occupied by (such as filled with) second electrically conductive material.

In still further example embodiments, the multiple electrically conductive paths disposed in the core include N electrically conductive paths, wherein N is greater than 2.

Further embodiments herein include receiving the circuit component as previously discussed and using the circuit component (apparatus) to fabricate a circuit. For example, a circuit board fabricator or fabrication system disposes the circuit component in a power converter affixed to a circuit board. In one embodiment, the power converter (such as voltage regulator) is operative to convert an input voltage into an output voltage.

In further example embodiments, when installing the circuit component in the power converter, the fabrication system disposes a length-wise axis of the first electrically conductive path to be orthogonal to a surface of the substrate; and the fabrication system disposes a length-wise axis of the second electrically conductive path to be orthogonal to the surface of the substrate. Alternatively, the fabrication system disposes a length-wise axis of the first electrically conductive path to be parallel to a planar surface of the substrate; and the fabrication system disposes a length-wise axis of the second electrically conductive path to be parallel to the planar surface of the substrate.

In further example embodiments, the one or more cutaway portions in the core of the circuit component include a first cutaway portion and a second cutaway portion. The fabrication system fills the first cutaway portion with first electrically conductive material; the fabrication system fills the second cutaway portion with second electrically conductive material. In one embodiment, the first electrically conductive material is operative to convey a first voltage supplied from the substrate; and the second electrically conductive material is operative to convey a second voltage supplied from the substrate.

In further example embodiments, the apparatus as discussed herein includes multiple cells such as: i) a first cell in which the first electrically conductive path resides, the first cell defined at least in part by the at least one cutaway portion; and ii) a second cell in which the second electrically conductive path resides, the second cell defined at least in part by the at least one cutaway portion.

Each of the cutaway portions can be fabricated in any suitable shape, form, size, etc. For example, in one embodiment, a cross-section of each of the at least one cutaway portion in the component is triangular, rectangular, trapezoidal, etc.

These and other more specific embodiments are disclosed in more detail below.

Note that any of the resources (such as a fabricator) implemented in the system as discussed herein can include one or more computerized devices, fabrication equipment, manufacturing equipment, circuit board assemblers, material handlers, controllers, mobile communication devices, handheld or laptop computers, or the like to carry out and/or support any or all of the method operations disclosed herein. In other words, one or more computerized devices or processors or corresponding equipment can be programmed and/or configured to operate as explained herein to carry out the different embodiments as described herein.

Yet other embodiments herein include software programs to perform the steps and operations summarized above and disclosed in detail below. One such embodiment comprises a computer program product including a non-transitory computer-readable storage medium (i.e., any computer readable hardware storage medium) on which software instructions are encoded for subsequent execution. The instructions, when executed in a computerized device (hardware) having a processor, program and/or cause the processor (hardware) to perform the operations disclosed herein. Such arrangements are typically provided as software, code, instructions, and/or other data (e.g., data structures) arranged or encoded on a non-transitory computer readable storage medium such as an optical medium (e.g., CD-ROM), floppy disk, hard disk, memory stick, memory device, etc., or other a medium such as firmware in one or more ROM, RAM, PROM, etc., or as an Application Specific Integrated Circuit (ASIC), etc. The software or firmware or other such configurations can be installed onto a computerized device to cause the computerized device to perform the techniques explained herein.

Accordingly, embodiments herein are directed to a method, system, computer program product, etc., that supports operations as discussed herein.

One embodiment includes a fabricator such as including computer readable storage medium and/or system having instructions stored thereon to fabricate an inductor component as described herein. The instructions, when executed by computer processor hardware, cause the computer processor hardware (such as one or more co-located or disparately located processor devices or hardware) to: fabricate a core of the circuit component to include magnetic permeable material; extend multiple electrically conductive paths through the core of the magnetic permeable material, the multiple electrically conductive paths including a first electrically conductive path and a second electrically conductive path; and fabricate the core of the magnetic permeable material to include at least one cutaway portion operative to reduce inductive coupling between the first electrically conductive path and the second electrically conductive path.

The ordering of the steps above has been added for clarity sake. Note that any of the processing steps as discussed herein can be performed in any suitable order.

Other embodiments of the present disclosure include software programs and/or respective hardware to perform any of the method embodiment steps and operations summarized above and disclosed in detail below.

It is to be understood that the system, method, apparatus, instructions on computer readable storage media, etc., as discussed herein also can be embodied strictly as a software program, firmware, as a hybrid of software, hardware and/or firmware, or as hardware alone such as within a processor (hardware or software), or within an operating system or a within a software application.

Note further that although embodiments as discussed herein are applicable to switching power supplies, the concepts disclosed herein may be advantageously applied to any other suitable topologies.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of embodiments herein (BRIEF DESCRIPTION OF EMBODIMENTS) purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention (s), the reader is directed to the Detailed Description section (which is a summary of embodiments) and corresponding figures of the present disclosure as further discussed below.

BRIEF DESCRIPTION OF THE DRAWINGS

FIG. 4A is an example diagram illustrating a magnetic flux coupling amongst multiple conductive paths according to embodiments herein.

FIG. 4B is an example diagram illustrating implementation of multiple cutaway portions to reduce inductive coupling amongst multiple inductive paths in a circuit component according to embodiments herein.

FIG. 4C is an example diagram illustrating implementation of multiple cutaway portions to reduce inductive coupling amongst multiple inductive paths in a circuit component according to embodiments herein.

FIG. 5A is an example diagram illustrating a top view of a circuit component according to embodiments herein.

FIG. 5B is an example diagram illustrating a side view of a circuit component according to embodiments herein.

FIG. 6A is an example diagram illustrating a top view of a circuit component and implementation of cutaway portions at a first width according to embodiments herein.

FIG. 6B is an example diagram illustrating a top view of a circuit component and implementation of cutaway portions at a second width according to embodiments herein.

FIG. 6C is an example diagram illustrating a top view of a circuit component and implementation of cutaway portions at a third width according to embodiments herein.

FIG. 7A is an example diagram illustrating a change in inductive coupling amongst multiple inductive paths in a circuit component based on implementation of different depths of cutaway portions according to embodiments herein.

FIG. 7B is an example diagram illustrating a change in inductance of inductive paths in a circuit component based on implementation of different depths of cutaway portions according to embodiments herein.

FIG. 8A is an example diagram illustrating a top view of a circuit component fabricated to include electrically conductive material according to embodiments herein.

FIG. 8B is an example diagram illustrating a top view of a circuit component fabricated to include electrically conductive material according to embodiments herein.

Figure 1:
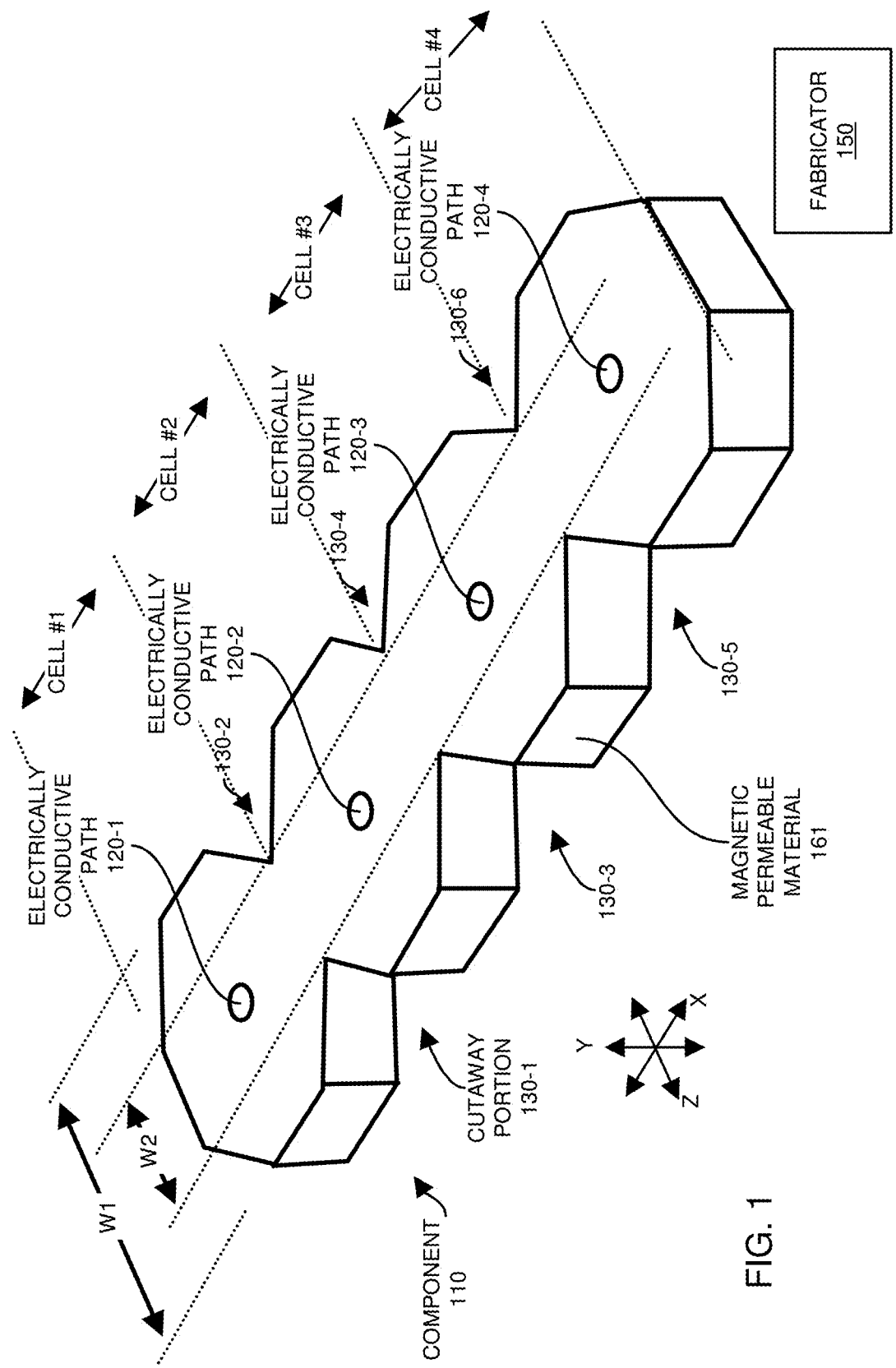
FIG. 1 is an example three-dimensional view of an inductive circuit component according to embodiments herein.

The foregoing and other objects, features, and advantages of embodiments herein will be apparent from the following more particular description herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

According to one configuration, a fabricator fabricates a core of a circuit component to include magnetic permeable material. The fabricator further produces the circuit component to include multiple electrically conductive paths extending through the core of the magnetic permeable material such as from one surface to another. In one arrangement, the multiple electrically conductive paths include a first electrically conductive path and a second electrically conductive path. The fabricator further fabricates the circuit component and, more specifically, the core of the magnetic permeable material to include at least one cutaway portion that is operative to reduce inductive coupling between the first electrically conductive path and the second electrically conductive path disposed in the core.

Now, with reference to the drawings, FIG. 1 is an example three-dimensional view of an inductive circuit component according to embodiments herein.

In this example embodiment, the fabricator 150 receives materials such as one or more of metal (electrically conductive material), metal alloy, magnetic permeable material, etc.

Based on the received material, the fabricator 150 fabricates a core of the circuit component 110 (such as a monolithic solid structure) via magnetic permeable material 161. The fabricator 150 further produces the circuit component 110 to include multiple electrically conductive paths 120 (such as electrically conductive path 120-1, electrically conductive path 120-2, electrically conductive path 120-3, electrically conductive path 120-4) extending through the core of the magnetic permeable material 161. In one embodiment, the fabricator 150 drills holes through the magnetic permeable material 161 and fills in the holes with electrically conductive material to produce the electrically conductive paths 120.

If desired, each of the electrically conductive paths 120 is surrounded with a layer of insulative material (such as non-electrically conductive material) such that the electrically conductive paths do not come in contact with the core magnetic permeable material 161. In other words, each electrically conductive path 120 is optionally coated with an insulation layer of material disposed between the corresponding electrically conductive path and the magnetic permeable material 161.

In further example embodiments, the fabricator 150 fabricates the circuit component 110 and, more specifically, the core of the magnetic permeable material 161 to include one or more cutaway portions 130 (such as one or more of cutaway portion 130-1, cutaway portion 130-2, cutaway portion 130-3, cutaway portion 130-4, cutaway portion 130-5, cutaway portion 130-6).

As further discussed herein, presence of the cutaway portions 130 at respective one or more locations of the circuit component 110 as shown reduces inductive coupling between each pair of electrically conductive paths such as between: i) the first electrically conductive path 130-1 and the second electrically conductive path 130-2, ii) the second electrically conductive path 130-2 and a third second electrically conductive path 130-3, iii) the third electrically conductive path 130-3 and the fourth electrically conductive path 130-4.

Note that the implementation of four electrically conductive paths disposed in the component 110 is shown by way of nonlimiting example embodiment only. In still further example embodiments, the multiple electrically conductive paths 120 disposed in the core include a number N electrically conductive paths, wherein N is any value greater than 2.

As previously discussed, via fabrication operations executed by the fabricator 150, the one or more cutaway portions 130 of the magnetic permeable material 161 includes cutaway portion 130-1, cutaway portion 130-2, cutaway portion 130-3, cutaway portion 130-4, cutaway portion 130-5, cutaway portion 130-6, etc. In this example embodiment, the magnetic permeable material 161 is absent from the cutaway portion 130-1, cutaway portion 135-2, cutaway portion 130-3, cutaway portion 130-4, cutaway portion 130-5, cutaway portion 130-6, etc.

In still further example embodiments, in addition to the one or more cutaway portions 130, the fabricator 150 produces the circuit component 110 to include a portion of magnetic permeable material (such as a continuum of magnetic permeable material 161 without breaks or voids) between each pair of electrically conductive paths such as between: i) electrically conductive path 120-1 and electrically conductive path 120-2, ii) electrically conductive path 120-2 and electrically conductive path 120-3, iii) electrically conductive path 120-3 and electrically conductive path 120-4.

In one embodiment, the fabricator 150 controls the dimensions of circuit component 110 to control a degree to which the pairs of adjacent electrically conductive path are inductively coupled. For example, the fabricator 150 produces the circuit component 110 to have a width, W1, along the z-axis. The fabricator 150 controls the degree of inductive coupling between successive pairs of electrically conductive paths via the width W2 between the respective opposing cutaway portion pairs (such as between first pair including cutaway portion 130-1 and cutaway portion 130-2, between second pair including cutaway portion 130-3 and cutaway portion 130-4, and so on).

For example, in one embodiment, the fabricator 150 decreases an amount of inductive coupling between respective pairs of electrically conductive paths via implementation of a smaller width W2 (lower in magnitude, larger cutaway) between respective cutaway portions 130. Conversely, the fabricator 150 increases an amount of inductive coupling between respective pairs of electrically conductive paths via implementation of a wider width W2 between respective cutaway portions 130.

Note further that presence of the magnetic permeable material 161 transforms each electrically conductive path into an inductive path (i.e., inductor device 110). For example, flow of current through the electrically conductive path 120-1 (inductive path) results in generation of respective magnetic flux according to the right hand rule.

As its name suggests, the magnetic permeable material 161 surrounding the electrically conductive paths 120 is magnetic permeable. The magnetic permeable material can be fabricated from any suitable matter. In one embodiment, by way of non-limiting example embodiment, the core material 120 has a flux permeability between 10-100 Henries/meter or any other suitable values or ranges.

In yet further embodiments, note again that electrically conductive paths can be fabricated from any suitable conductive material such as metal, a metal alloy (combination of multiple different metals including electrically conductive material such as copper, tin, etc.), etc.

Note further that the electrically conductive path 131 can be fabricated as any suitable shape such as rod-shaped, pillar-shaped, etc.

In one embodiment, each electrically conductive path in the magnetic permeable material 161 is a non-winding circuit path extending through the inductor device 110 along (parallel to) the Y axis. Note that each inductor disposed in the shared medium (i.e., magnetic permeable material 161) can be fabricated as being cylindrical or any other suitable shape.

Thus, embodiments herein include a novel circuit component 110 comprising a common core (structure) of magnetic permeable material 161. Implementation of multiple inductor devices in the same structure of magnetic permeable material 161 associated with the circuit component 110 facilitates mounting or affixing the corresponding circuit component 110 on a respective circuit substrate and assembly of a respective circuit. Implementation of the multiple inductor devices in the same structure of circuit component 110 enables fabrication of smaller footprint circuits.

As previously discussed, the state-of-the-art (conventional) multiphase solutions include implementing independent magnetic devices and independent cores for each phase of a power supply rather than providing an integrated monolithic structure as described herein. The conventional individual inductor components are non-optimal from the point of view of total board space consumption, which leads to a larger sized system. This impacts not only the overall power density of generating power, but also limits options how physically close the inductor components can be placed near a corresponding power load.

Accordingly, embodiments herein propose a monolithic magnetic structure (such as block of magnetic permeable material 161) having a linear arrangement of single-turn inductor paths (such as electrically conductive paths 120), where the lateral coupling of neighboring phases (electrically conductive paths 120) can be adjusted from a first amount of inductive coupling to basically no inductive coupling by means of geometric cut-outs (cutaway portions) of the core magnetic permeable material 161.

In certain instances, the magnetic structure (circuit component 110) enables vertical power flow and the integration of a multi-phase arrangement of single-turn inductors. Note that the core magnetic permeable material 161 can be fabricated to include single or distributed airgaps per phase (or none at all) between pairs of electrically conductive paths, even though the main embodiment is a solution without any airgaps between each pair of electrically conductive paths. A cut-out of core material (such as cutaway portion or void of magnetic permeable material 161) is not considered to be an airgap since it does not extend throughout the entire cross section of the core. In other words, the value of W2 is greater than zero, resulting in multiple inductive paths being rigidly disposed in the same circuit component 110 structure.

Figure 2:
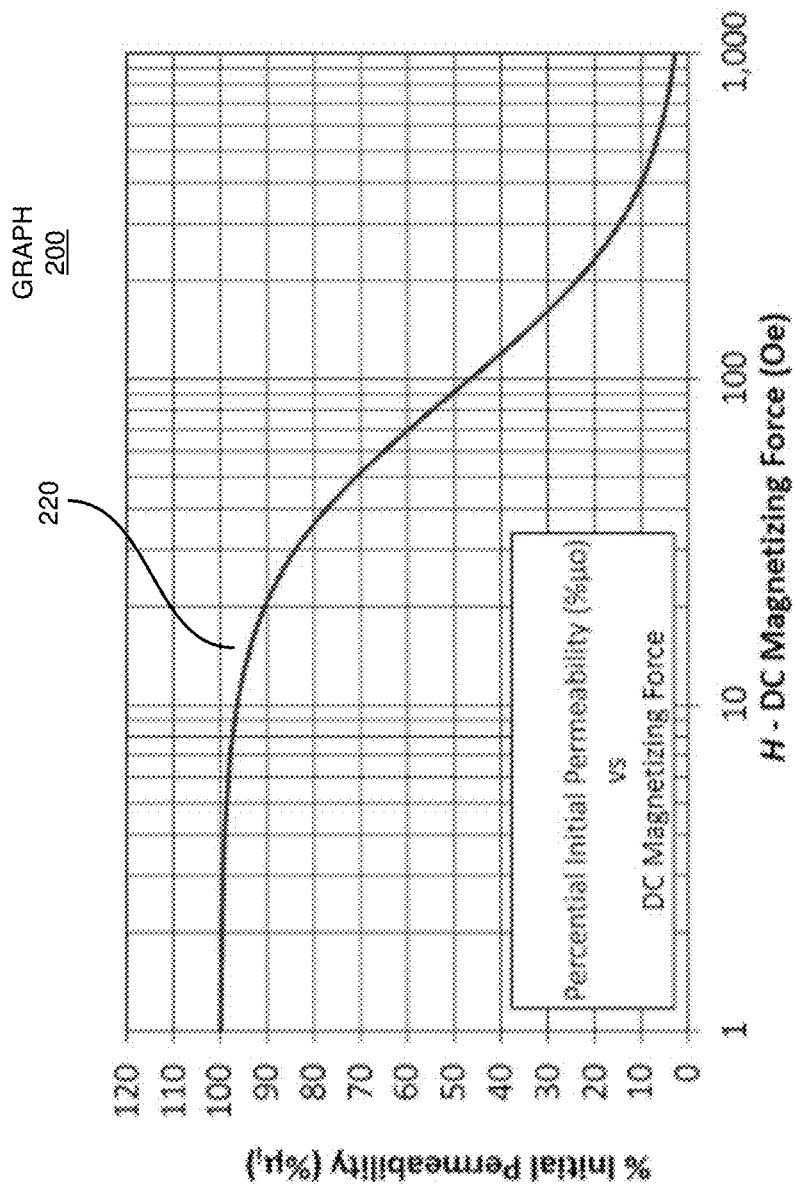
FIG. 2 is an example diagram illustrating magnetic permeability versus magnetic field of magnetic permeable material according to embodiments herein.

FIG. 2 is an example diagram illustrating magnetic permeability versus magnetic field of magnetic permeable material according to embodiments herein. In one embodiment, by way of non-limiting example, the circuit component 110 in FIG. 1 is fabricated as follows:

Initial core permeability $\mu$ of magnetically permeable material 161 is: 66

The corresponding $\mu$ vs Hdc curve as depicted in FIG. 2

Core height of magnetic permeable material 161 in Yang-axis: 2 mm

Single core XY dimensions: 6.75 mm×6.75 mm

Total core XY dimension: 30 mm

Electrically conductive path diameter (such as copper rod diameter): 1 mm

Current: 62.5 AmpsDC.

As previously discussed, the curve 220 in graph 200 of FIG. 2 illustrates Permeability vs DC magnetic field. As shown, the permeability softly decreases with increasing DC magnetic field, i.e., by increasing the current in a respective electrically conductive path (e.g., single-turn inductor).

Figure 3:
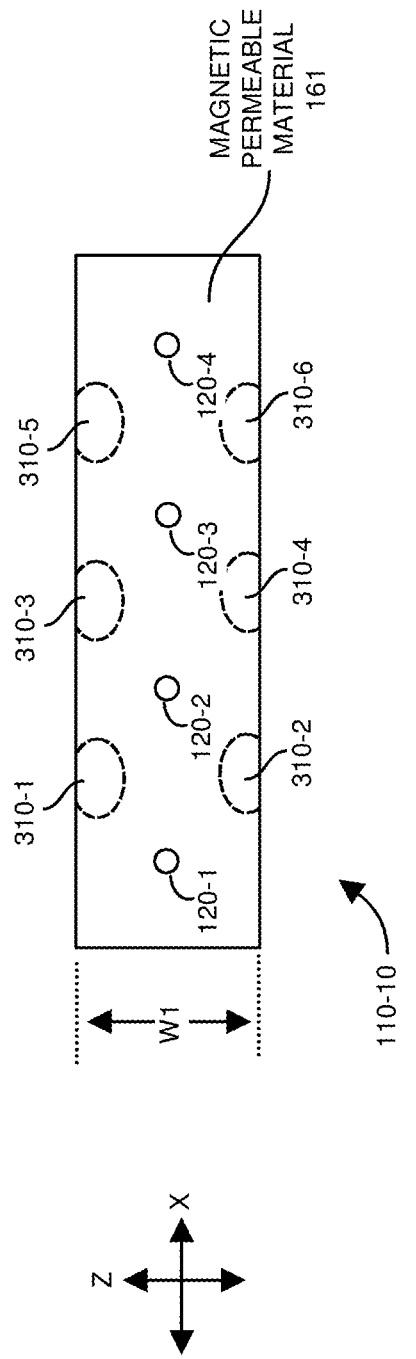
FIG. 3 is an example diagram illustrating regions of a shared core area, where a mutual flux do exist, of an inductor circuit component resulting in inductive coupling between multiple conductive paths according to embodiments herein.

FIG. 3 is an example diagram illustrating regions of a shared core area (where a mutual flux exists) resulting in inductive coupling between multiple conductive paths according to embodiments herein.

In one embodiment, without cutaway portions disposed in the magnetic permeable material 161, the circuit component 110-10 in FIG. 3 has an inductance for each of the four phases (electrically conductive paths 120) is 29 nH, while the coupling between each pair of neighboring electrically conductive paths (a.k.a., phases) is 4%. Thus, inductive coupling is fairly low even prior to implementing cutaway portions 130 in the magnetically permeable material 161.

This disclosure includes the observation that in some circuit applications, it might be desirable to reduce the coupling between successive pairs of electrically conductive paths to a controlled minimum value while retaining the monolithic core structure (of magnetic permeable material 161. The remaining coupling between pairs of phases (i.e., electrically conductive paths) is due to the shared core area of the magnetic permeable material 161 (such as volume 310-1, volume 310-2, volume 310-3, volume 310-4, volume 310-5, etc.), with a non-negligible amount of mutual magnetic flux.

Note that the following FIGS. 4-6 illustrate different examples of implementing voids cutaway portions, filled or unfilled with other material) in magnetically permeable material to reduce magnetic flux coupling according to embodiments herein.

With reference to FIG. 1 and other FIGS., the cutaway portions 130 as discussed herein are arranged symmetrically relative to a longitudinal axis (such as X-axis). In one embodiment, the electrically conductive paths (such as copper rods) are symmetric as well.

In further example embodiments, as discussed herein, one purpose of the cutaway portions is to eliminate/reduce the areas where a mutual flux exists between the adjacent electrically conductive paths 120. Since the placement of the electrically conductive paths 120 are symmetrical in the component 110 along the X-axis, their corresponding generated fluxes are symmetric as well, and therefore so they are the core area where a mutual flux exists, hence the cut-out (cutaway portions) are symmetrical in one embodiment. More specifically, as previously discussed with respect to FIG. 1, the cutaway portion 130-1 is disposed opposite the cutaway portion 130-2; cutaway portion 130-3 is disposed opposite cutaway portion 130-4, and so on. Thus, the location of the cutaway portions depends on the arrangement and/or locations of the electrically conductive paths 120 in the component 110.

Moreover, note that the component may include cutaway portions disposed on only one side of the component 110. For example, the component 110 may include cutaway portions 130-1, 130-3, and 130-5, without implementing cutaway portions 130-2, 130-4, and 130-6. In such an instance, this would result in less reduction of mutual coupling from one electrically conductive path output the next adjacent electrically conductive path.

In further example embodiments, note that the presence of the cutaway portions 130, confer to the whole structure of component 110, a configuration exhibiting a plurality of adjacent and consecutive "cells" each having one of the conductive paths arranged therethrough. For example, the component 110 of FIG. 1 includes: cell #1 (inclusive of the electrically conductive path 120-1 and corresponding surrounding magnetically permeable material 161), cell #2 (inclusive of the electrically conductive path 120-2 and corresponding surrounding magnetically permeable material 161), cell #3 (inclusive of the electrically conductive path 120-3 and corresponding surrounding magnetically permeable material 161), cell #4 (inclusive of the electrically conductive path 120-1 and corresponding surrounding magnetically permeable material 161).

As previously discussed, the component 110 as discussed herein can include any number of cells along the X-axis, Z-axis, etc. Accordingly, embodiments herein include a one dimensional array of cells, a two dimensional array of cells, etc.

In one embodiment, each of the cells has identical shapes. However, this is optional as the shapes of the cells, corresponding cross sections and volumes of cutaway portions, etc., in the respective component 110 can vary depending on the embodiment.

In still further embodiments, note that the adjacent and consecutive cells configuration of the component 110 as well as their spacing provides a way to maximize the inductance of each electrically conductive path (given the available area and its form-factor) and keep the coupling from one electrically conductive path to the next to a reduced or minimum value (without introducing air-gaps and cut-outs). Embodiments herein include core geometries and winding arrangements that are different from the component 110 shown in FIG. 1 and where there are no symmetries between rods. In such an instance, the cutaway portions or cut-outs (aimed to remove the shared core area where a mutual flux exists) and the resulting core structure might not be symmetrical as well.

Yet further, as previously discussed, note again that the shapes of the cutaway portions can vary depending on the embodiment. Note again that tuning of the coupling between and/or amongst the different cells and corresponding electrically conductive paths by removing/reducing the corresponding core area (such as via cutaway portions as previously discussed) where mutual flux exists.

FIG. 4A is an example diagram illustrating a top view of a circuit component and presence of magnetic flux coupling amongst multiple conductive paths in a circuit component without cutaway portions according to embodiments herein.

In this embodiment, flow of current through the electrically conductive path 120-2 causes generation of flux 450 according to the right-hand rule. The presence of magnetic flux 450 produced by the current through electrically conductive path 120-2 results in a corresponding amount of current flowing through electrically conductive path 120-1 and electrically conductive path 120-3 as a result of magnetic flux 450. In other words, the inductive coupling between electrically conductive path 120-2 and electrically conductive path 120-1 causes current to flow through the electrically conductive path 120-1 based on current flowing through the communication path 120-2.

More specifically, as a result of inductive coupling between the electrically conductive path 120-2 and the electrically conductive path 120-1, flow of current through the electrically conductive path 120-2 causes a corresponding small amount of current to flow through electrically conductive path 120-1. Similarly, as a result of inductive coupling between the electrically conductive path 120-2 and the electrically conductive path 120-3, flow of current through the electrically conductive path 120-2 causes a corresponding small amount of current to flow through electrically conductive path 120-3.

The following drawings illustrate how implementation of one or more cutaway portions in the circuit component 110 results in reduced inductive coupling between pairs of neighboring electrically conductive paths.

FIG. 4B is an example diagram illustrating implementation of multiple cutaway portions to reduce inductive coupling amongst multiple inductive paths in a circuit component according to embodiments herein.

As previously discussed, in one embodiment, the fabricator 150 fabricates the circuit component 110 to include a portion (such as a continuum without breaks in material) of magnetic permeable material 161.

Additionally, or alternatively, the fabricator 150 fabricates the circuit component 110 to include a cutaway portion 130-1 (such as triangle top view cross section cutaway portion) and a cutaway portion 130-2 (such as triangle top view cross section cutaway portion) in which the magnetic permeable material 161 is absent from both the cutaway portion 130-1 and the cutaway portion 130-2. The fabricator 150 fabricates the circuit component 110 to include a cutaway portion 130-3 (such as triangle top view cross section cutaway portion) and a cutaway portion 130-4 (such as triangle top view cross section cutaway portion) in which the magnetic permeable material 161 is absent from both the cutaway portion 130-3 and the cutaway portion 130-4.

Absence of the magnetic permeable material 161 at one or more locations of the circuit component 110-1 reduce flow of mutual magnetic flux 450 and thus inductive coupling between the electrically conductive path 130-2 and the electrically conductive path 130-1. As previously discussed, presence of the magnetic permeable material 161 surrounding the electrically conductive paths 120 results in each of the electrically conductive paths being inductive paths in the circuit component 110-1.

In further example embodiments, the fabricator 150 fabricates the at least one cutaway portion in the circuit component to include a first cutaway portion 130-1. In one embodiment, the first cutaway portion 130-1 is disposed in both a flux path (see magnetic flux 450) associated with flow of first current through the electrically conductive path 120-2 and flow of second current through the electrically conductive path 120-1. As further discussed below, the cutaway portions are not limited to a particular shape or axis.

FIG. 4C is an example diagram illustrating implementation of multiple cutaway portions to reduce inductive coupling amongst multiple inductive paths in a circuit component according to embodiments herein.

This example embodiment illustrates how the fabricator 150 disposes each of the electrically conductive paths 120 in parallel with respect to the Y axis and each other such that the each of the electrically conductive paths 120 extends from a first surface 481 of the circuit component 110-1 to a second surface 482 of the circuit component 110-1.

In this embodiment, if desired, implementation of the cutaway portions 430-1, 430-2, 430-3, 430-4, etc. (such as slice, slit, rectangular cross section cutout, etc.), along the Z-axis also may be used to disrupt magnetic flux 450 to reduce a degree of inductive coupling between pairs of electrically conductive paths.

FIG. 5A is an example diagram illustrating a top view of a circuit component according to embodiments herein.

As previously discussed, the fabricator 150 controls a width W2 associated with fabrication of the cutaway portions. In one embodiment, each of the cutaway portions 130 (such as triangle top view cross section) is wedge shaped, although the cutaway portions can be any suitable shape or size. Note that the cutaway portions 130 can be fabricated in any suitable manner.

For example, in one embodiment, the fabricator 150 implements a tool to physically cut away an existing portion of the magnetic permeable material 161 to produce each cutaway portion. Add, or alternatively, the fabricator 150 produces the structure of magnetic permeable material 161 via filling a mold including the cutaway portions. In this latter instance, it is not necessary to fabricate the cutaway portions via removal of magnetic permeable material 161 in such regions.

FIG. 5B is an example diagram illustrating a side view of a circuit component according to embodiments herein.

As shown in this example embodiment, each of the electrically conductive paths (electrically conductive path 120-1, electrically conductive path 120-2, electrically conductive path 120-3, and electrically conductive path 120-4) extends in parallel from surface 581 of the circuit component 110 to the surface 582.

FIG. 6A is an example diagram illustrating a top view of a circuit component and implementation of cutaway portions at a first width according to embodiments herein.

As previously discussed, implementation of one or more cutaway portions 130 (such as trapezoidal shaped cutaway portion from top view cross section) of the magnetic permeable material 161 in circuit component 110 (such as a monolithic magnetic structure—single solid piece of magnetic permeable material 161) controls inductive coupling amongst the electrically conductive paths.

In one embodiment, the purpose of such cut-outs (such as cutaway portions 130) is to reduce the shared core area (volume) where mutual flux exists in the magnetic permeable material 161 until the desired coupling is achieved between neighboring pairs of electrically conductive paths. For example, the amount of magnetic (inductive) coupling between respective pairs of electrically conductive paths depends on the remaining shared portion of magnetic permeable material 161 (core area) and therefore can be tuned by width W2.

In the example embodiment shown in FIG. 6A, the fabricator 150 controls the width associated with the cutaway portions 130 to be a value of W2-1 in example circuit component 110-1.

FIG. 6B is an example diagram illustrating a top view of a circuit component and implementation of cutaway portions at a second width according to embodiments herein. In the example embodiment shown in FIG. 6B, the fabricator 150 controls the width associated with the cutaway portions 130 to be a value of W2-2 in example circuit component 110-2.

FIG. 6C is an example diagram illustrating a top view of a circuit component and implementation of cutaway portions at a third width according to embodiments herein.

In the example embodiment shown in FIG. 6C, the fabricator 150 controls the width associated with the cutaway portions 130 to be a value of W2-3 in example circuit component 110-3. This results in the lowest inductive coupling between the pairs of neighboring electrically conductive paths.

FIG. 7A is an example diagram illustrating a change in inductive coupling amongst multiple inductive paths in a circuit component based on implementation of different depths of cutaway portions according to embodiments herein.

In this example embodiment, the curve 711 in graph 710 represents a variation in inductive coupling associated with the neighboring pairs of electrically conductive paths depending upon a width of W2 (which corresponds to the depth of the cutaway portions) implemented by the fabricator 150. For example, as previously discussed, larger values of width W2 (smaller sized cutaway portions 130) result in greater inductive coupling and greater overall inductance per electrically conductive path. Conversely, smaller values of width W2 result in lower inductive coupling and lower overall inductance.

FIG. 7B is an example diagram illustrating a change in inductance of inductive paths in a circuit component based on implementation of different depths of cutaway portions according to embodiments herein.

As previously discussed, and as shown in graph 720, the reduction of the core area of magnetic permeable material 161 (via cutaway portions) in each circuit component 110 results in an increase of respective reluctance; that is, the deeper the cut-out (the smaller the width W2), the lower the inductance of each respective inductive path (electrically conductive path) as shown in graph 720. Therefore, a trade-off between inductive coupling and inductance exists and it is left to the fabricator 150 to choose the optimum coupling and inductance values (via selection of proper sizing of W2 and other dimensions associated with the circuit component) according to the desired component requirements.

FIG. 8A is an example diagram illustrating a circuit component fabricated to include electrically conductive material according to embodiments herein.

In further example embodiments, the fabricator 150 (such as fabrication system) fills one or more of the cutaway portions 130 with electrically conductive material. For example, in one embodiment, the fabricator 150 fills the first cutaway portions 130-1, 130-3, and 130-5 of circuit component 110-3 with first electrically conductive material 820-1 (such as metal); the fabricator 150 fills second cutaway portions 130-2, 130-4, and 130-6 with second electrically conductive material 820-2 (such as metal).

Thus, in one embodiment, the first cutaway portion 130-1 is occupied by (such as filled with) first electrically conductive material 820-1. The fabricator 150 fabricates the at least one cutaway portion in circuit component 110-3 to further include a second cutaway portion 130-2;

the second cutaway portion 130-2 is occupied by (such as filled with) second electrically conductive material 820-2.

FIG. 8B is an example diagram illustrating a circuit component fabricated to include electrically conductive material according to embodiments herein.

In this example embodiment, the electrically conductive material (such as metal or other conductor) disposed in each of the respective cutaway portions are electrically isolated from each other.

More specifically, in this example embodiment, via fabricator 150, the cutaway portion 130-1 is filled with electrically conductive material 850-1; the cutaway portion 130-2 is filled with electrically conductive material 850-2; the cutaway portion 130-3 is filled with electrically conductive material 850-3; the cutaway portion 130-4 is filled with electrically conductive material 850-4; the cutaway portion 130-5 is filled with electrically conductive material 850-5; the cutaway portion 130-6 is filled with electrically conductive material 850-6.

Respective corners of the core of magnetic permeable material 161 include electrically conductive material 850-7, 850-8, 850-9, and 850-10.

Again, in this embodiment, each of the instances of electrically conductive material 850 filling respective cutaway portions is isolated from each other such that each instance of electrically conductive material is able to convey a different signal or voltage.

Figure 9:
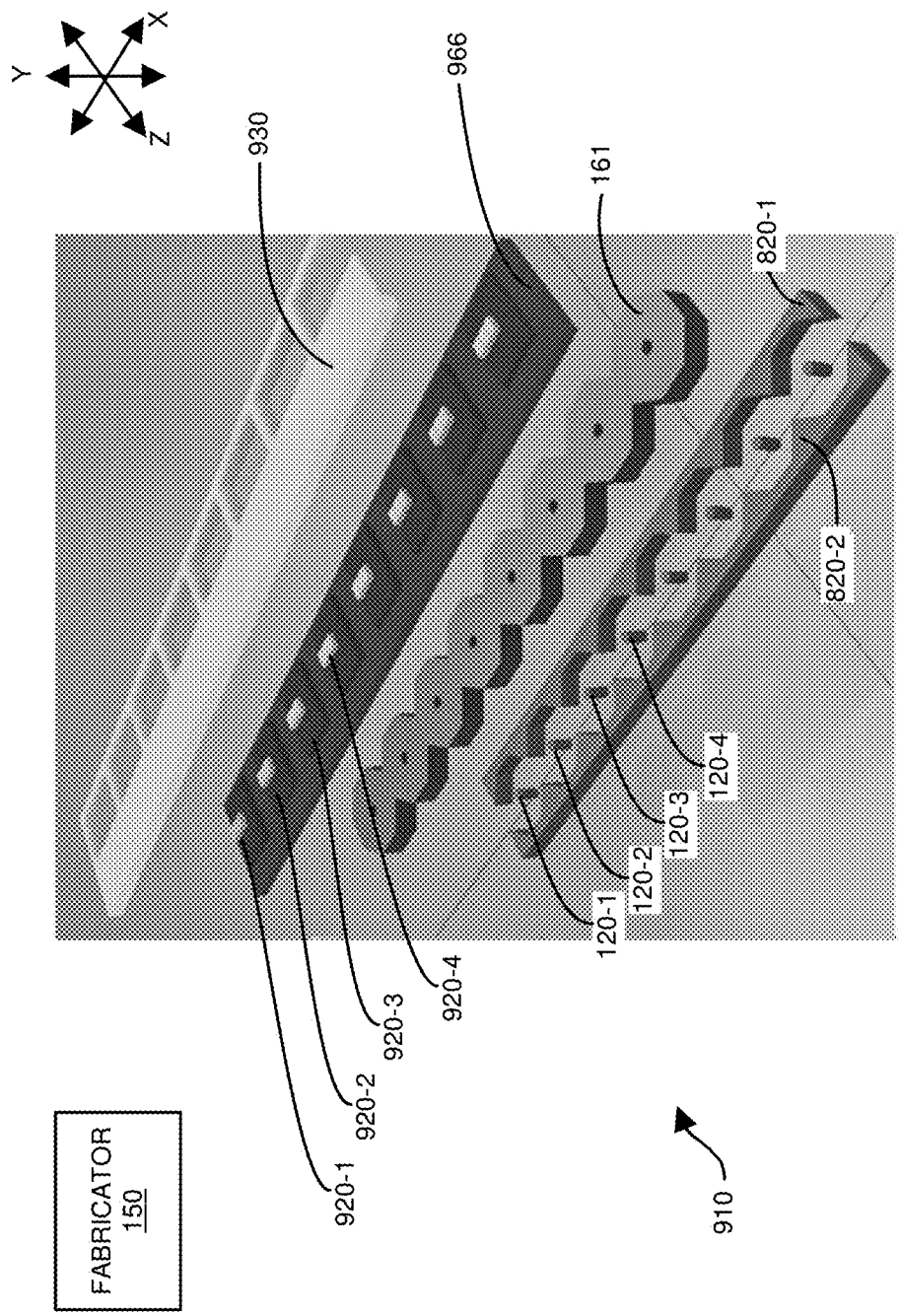
FIG. 9 is an example exploded view diagram illustrating a voltage regulator circuit assembly according to embodiments herein.

FIG. 9 is an example exploded view diagram illustrating a voltage regulator circuit assembly according to embodiments herein.

In this example embodiment, the power supply assembly 910 includes electrically conductive material 820-1, electrically conductive material 820-2, electrically conductive paths 120, core of magnetic permeable material 161, circuit board 966 including circuitry 920-1, circuitry 920-2, circuitry 920-3, etc., and protective cover 930 or heat sink.

In one embodiment, each of the instances of circuitry 920-1, 920-2, 920-3, etc., includes respective one or more switches and control circuitry to control an amount of current flowing through respective electrically conductive paths.

For example, in one embodiment, the circuitry 920-1 is configured to control a magnitude of current through electrically conductive path 120-1; the circuitry 920-2 is configured to control a magnitude of current through electrically conductive path 120-2; the circuitry 920-3 is configured to control a magnitude of current through electrically conductive path 120-3; and so on.

In one embodiment, the first electrically conductive material 820-1 is operative to electrically convey a first voltage (such as an input voltage) supplied from a substrate on which the assembly 910 is mounted to the respective instances of power supply circuitry 920; the second electrically conductive material 820-2 is operative to electrically connect the respective instances of power supply circuitry 920 to a second voltage (such as ground reference voltage) supplied from a substrate on which the assembly is mounted.

Figure 10:
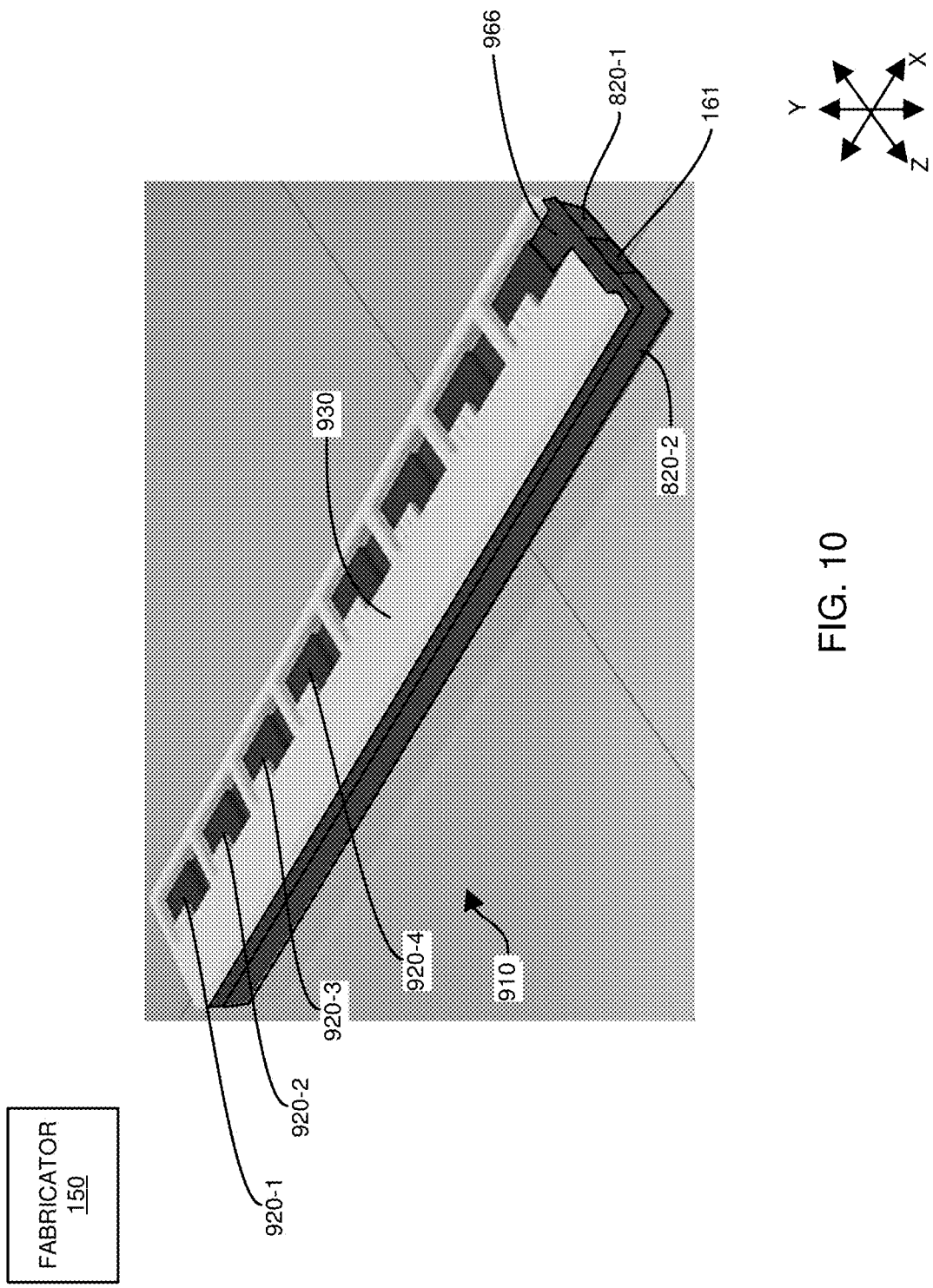
FIG. 10 is an example diagram illustrating a voltage regulator circuit assembly according to embodiments herein.

FIG. 10 is an example diagram illustrating a voltage regulator circuit assembly according to embodiments herein.

In this example embodiment, the circuit assembly 910 is assembled as an array of power supply circuitry 920 controlling flow of current through respective electrically conductive paths and generation of one or more output voltages to power a load. As previously discussed, the assembly 910 can be mounted in a respective circuit board (substrate).

Figure 11:
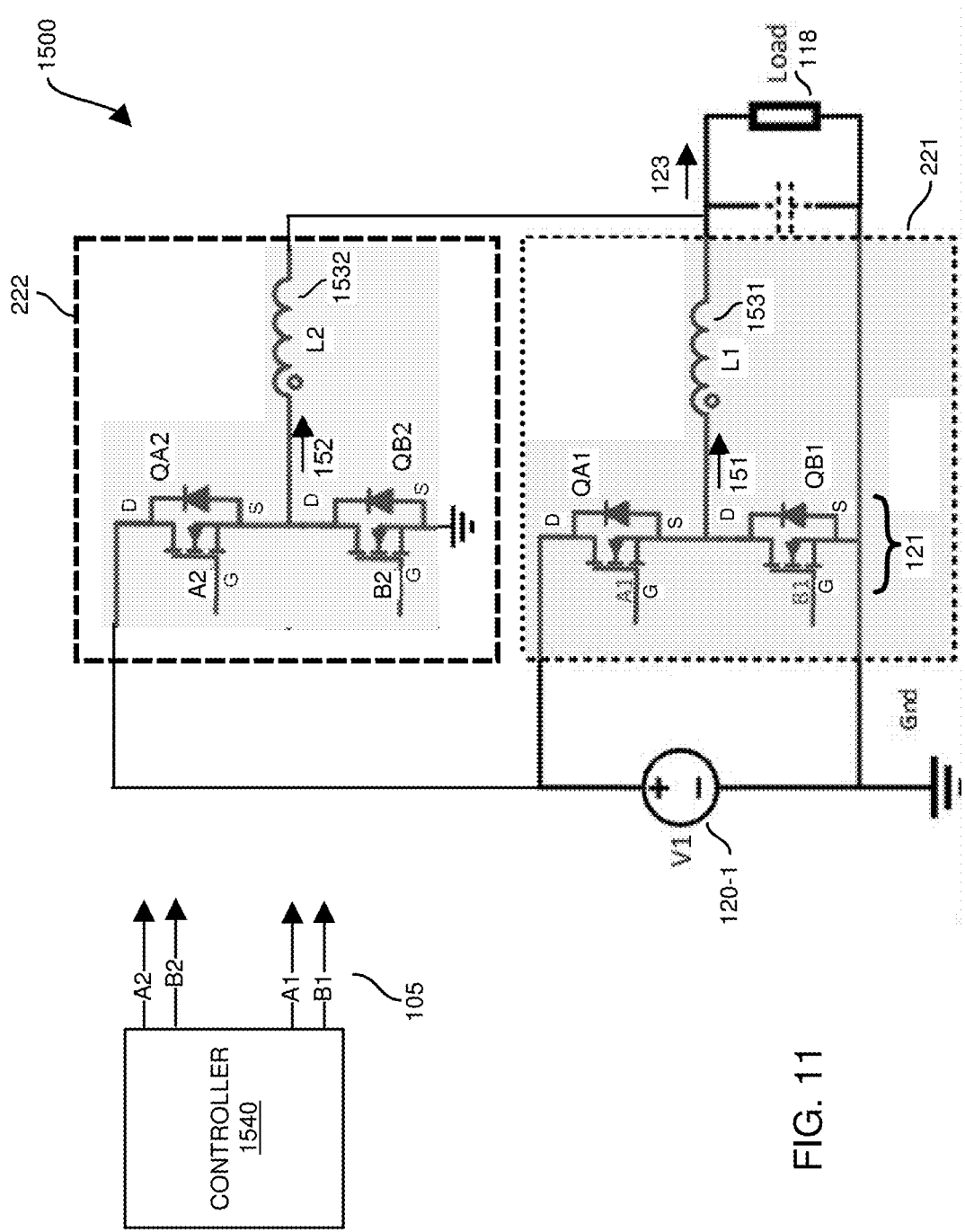
FIG. 11 is an example diagram illustrating connectivity of circuit components in a power supply including one or more inductor devices according to embodiments herein.

FIG. 11 is an example diagram illustrating connectivity of circuit components in a power supply according to embodiments herein.

In this non-limiting example embodiment, the power supply 1500 includes controller 1540 and multiple phases 221 and 222 that collectively generate a respective output voltage 123 (output current) to power load 118. The load 118 can be any suitable circuit such as CPUs (Central Processing Units), GPUs and ASICs (such those including one or more Artificial Intelligence Accelerators), etc., which can be located on standalone circuit board or remote circuit board.

Note that power supply 1500 can include any number of phases. If desired, the phases can be split such that the first phase 221 powers a first load independent of the second phase 222 powering a second load. Alternatively, the combination of phase 221 and phase 222 drive the same load 118.

As shown in the example embodiment of operating a combination of the phase 221 and phase 222 to power the same load 118, phase 221 includes switch QA1, switch QB1, and inductive path 1531 (such as electrically conductive path 120-1). Phase 222 includes switch QA2, switch QB2, and inductive path 1532.

Further in this example embodiment, the voltage source 120-1 supplies voltage V1 (such as 6 VDC or any suitable voltage) to the series combination of switch QA1 (such as a high-side switch) and switch QB1 (such as a low-side switch).

In one embodiment, the combination of switch QA1 and QB1 as well as inductive path 1531 (inductor such as implemented via electrically conductive path 120-1 of circuit component 110) operate in accordance with a buck converter topology to produce the output voltage 123.

Further in this example embodiment, note that the drain node (D) of switch QA1 is connected to receive voltage V1 provided by voltage source 120-1. The source node (S) of switch QA1 is coupled to the drain node (D) of switch QB1 as well as the input node of inductive path 1531. The source node of switch QB1 is coupled to ground. The output node of the inductive path 1531 is coupled to the load 118.

Yet further in this example embodiment, the drain node of switch QA2 of phase 222 is connected to receive voltage V1 provided by voltage source 120-1. The source node (S) of switch QA2 is coupled to the drain node (D) of switch QB2 as well as the input node of inductive path 1532 (inductor such as implemented via electrically conductive path 120-2 of circuit component 110). The source node of switch QB2 is coupled to ground. The output node of the inductive path 1532 is coupled to the load 118.

As previously discussed, the combination of the phases 221 and 222 produces the output voltage 123 that powers load 118. That is, the inductive path 1531 produces output voltage 123; inductive path 1532 produces output voltage 123 as well.

During operation, as shown, controller 1540 produces control signals 105 (such as control signal A1 and control signal B1) to control states of respective switches QA1 and QB1. For example, the control signal A1 produced by the controller 1540 drives and controls the gate node of switch QA1; the control signal B1 produced by the controller 1540 drives and controls the gate node of switch QB1.

Additionally, controller 1540 produces control signals A2 and B2 to control states of switches QA2 and QB2. For example, the control signal A2 produced by the controller 1540 drives and controls the gate node of switch QA2; the control signal B2 produced by the controller 1540 drives and controls the gate node of switch QB2.

In one embodiment, the controller 1540 controls the phases 221 and 222 to be 180 degrees out of phase with respect to each other.

As is known with buck converters, in phase 221, activation of the high-side switch QA1 to an ON state while switch QB1 is deactivated (OFF) couples the input voltage V1 to the input of the inductive path 1531, causing an increase (such as ramped) in amount of current provided by the inductive path 1531 to the load 118. Conversely, activation of the low-side switch QB1 to an ON state while switch QA1 is deactivated (OFF) couples the ground reference voltage to the input of the inductive path 1531, causing a decrease (such as ramped) in amount of current provided by the inductive path 1531 to the load 118. The controller 1540 monitors a magnitude of the output voltage 123 and controls switches QA1 and QB1 such that the output voltage 123 stays within a desired voltage range.

Via phase 222, in a similar manner, activation of the high-side switch QA2 to an ON state while switch QB2 is deactivated (OFF) couples the input voltage V1 to the input of the inductive path 1532 causing an increase in amount of current provided by the inductive path 1532 to the load 118. Conversely, activation of the low-side switch QB2 to an ON state while switch QA2 is deactivated (OFF) couples the ground reference voltage to the input of the inductive path 1532, causing a decrease in amount of current provided by the inductive path 1532 to the load 118. The controller 1540 monitors a magnitude of the output voltage 123 and controls switches QA2 and QB2 such that the output voltage 123 stays within a desired voltage range.

Figure 12:
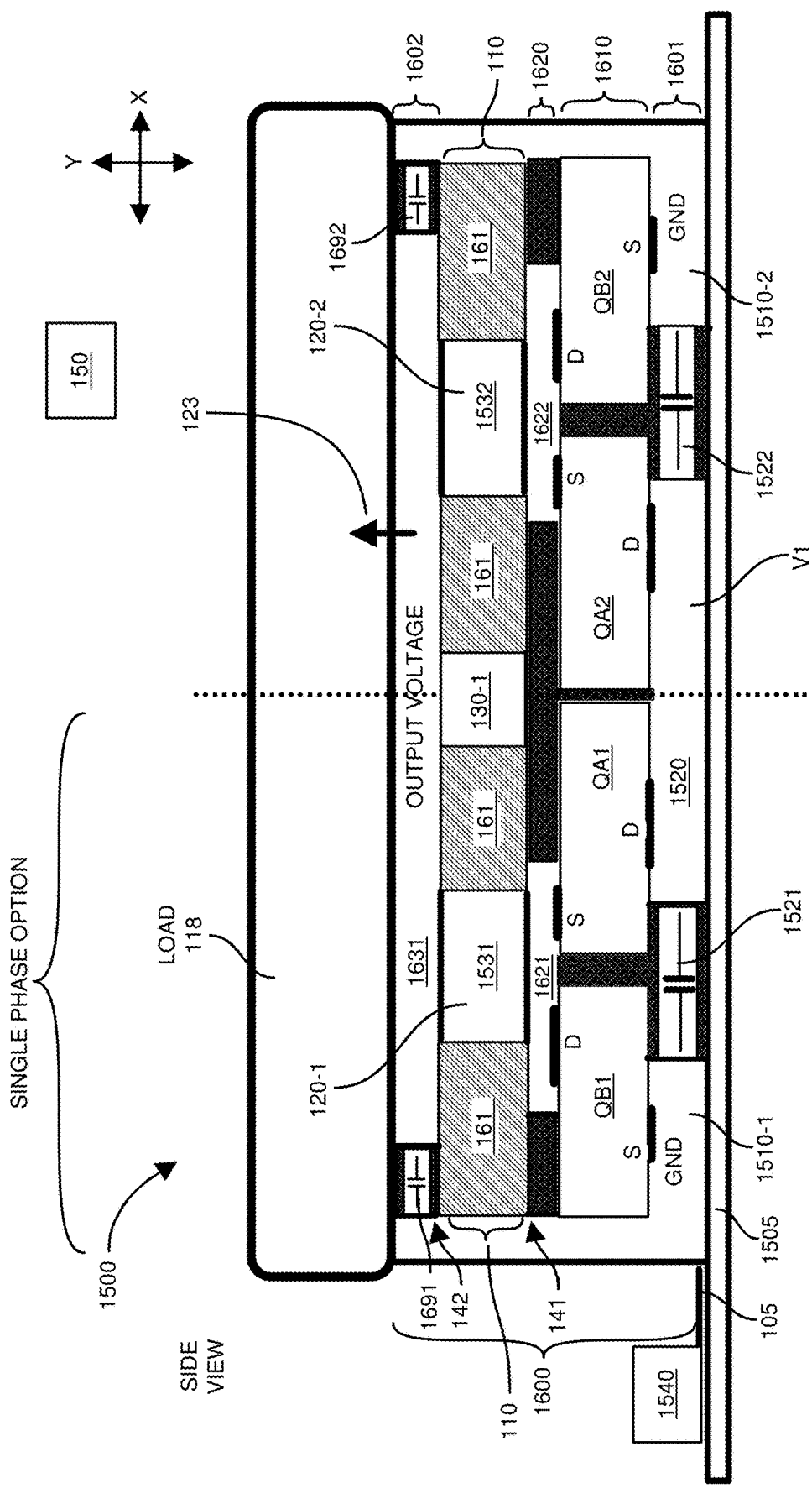
FIG. 12 is an example side view diagram illustrating a multi-phase power supply (in FIG. 11) and inductor devices supporting vertical power flow according to embodiments herein.

FIG. 12 is an example side view diagram illustrating the multi-phase power supply of FIG. 11 instantiated in a vertical stack according to embodiments herein.

Further embodiments herein include receiving the circuit component 110 (such as including electrically conductive path 120-1 and electrically conductive path 120-2) as previously discussed.

A circuit board fabricator 150 or fabrication system disposes the circuit component 110 in a power converter affixed to a circuit board (such as substrate 1505). In one embodiment, the power converter (such as voltage regulator) is operative to convert an input voltage into an output voltage.

In further example embodiments, when installing the circuit component in the power converter, the fabricator 150 disposes a length-wise axis of the first electrically conductive path 120-1 (a.k.a., inductive path 1531 along Y-axis) to be orthogonal to a planar surface of the substrate 1505; and the fabrication system disposes a length-wise axis of the second electrically conductive path 120-2 (a.k.a., inductive path 1532 along Y-axis) to be orthogonal to the surface of the substrate 1505.

The instantiation of power supply 1500 in this example embodiment supports vertical power flow. For example, the substrate 1505 and corresponding one or more power sources such as V1 supply power to the power supply stack assembly 1600, which in turn powers the dynamic load 118. Ground reference (GND) conveyed through the power supply stack assembly 1600 provides a reference voltage and return path for current conveyed through the stack to the load 118. As previously discussed, the cutaway portions (such as cutaway portion 130-1, cutaway portion 130-2, etc.) can be filled in with electrically conductive material that provides a respective path between the load 118 and the substrate 1505.

In one embodiment, the substrate 1505 is a circuit board (such as a standalone board, mother board, standalone board destined to be coupled to a mother board, etc.). The power supply stack assembly 1600 including one or more inductor devices is coupled to the substrate 1505. As previously discussed, the load 118 can be any suitable circuit such as CPUs (Central Processing Units), GPUs and ASICs (such those including one or more Artificial Intelligence Accelerators), which can be located on standalone circuit board.

Note that the inductive path 1531, 1532, etc., (instantiation of any of the inductor devices 110, etc., as discussed herein) in the power supply stack assembly 1600 can be instantiated in any suitable manner as described herein. In this non-limiting example embodiment, the power supply stack assembly 1600 includes one or more instantiation of any the inductor devices such as electrically conductive paths 120-1, 120-2, etc., as discussed herein. The power supply stack assembly 1600 can be configured to include any of number of the inductor devices (electrically conductive path) as described herein. In this example embodiment, the circuit component 110 includes two instances of electrically conductive paths 120-1 and 120-2.

Further in this example embodiment, the fabricator 150 fabricates power supply stack assembly 1600 (such as a DC-DC power converter) via stacking of multiple components including a first power interface 1601, one or more switches in switch layer 1610, connectivity layer 1620, one or more inductor assemblies (such as including circuit component 110 of inductor devices), and a second power interface 1602.

The fabricator 150 further disposes the first power interface 1601 at a base of the stack (power supply assembly 1600 of components). The base of power supply stack assembly 1600 (such as power interface 1601) couples the power supply stack assembly 1600 to the substrate 1505.

In one embodiment, fabricator 150 disposes capacitors 1521 and 1522 in a layer of the power supply stack assembly 1600 including the power interface 1601.

Yet further, when fabricating the power supply stack assembly 1600, the fabricator 150 electrically couples multiple switches such as switch QA1, QB1, QA2, and QB2 in the power supply stack assembly 1600 to the first power interface 1601. The first power interface 1601 and corresponding connectivity to the substrate 1505 enables the switches QA1, QB1, QA2, and QB2 to receive power such as power input such as input voltage V1 and GND reference voltage from the substrate 1505. One or more traces, power layers, etc., on substrate 1505 provide or convey the voltages from voltage (or power) sources to the power interface 1601 of the power supply stack assembly 1600.

As previously discussed, controller 1540 generates control signals 105 to control respective switches QA1, QB1, QA2, and QB2 in the power supply stack assembly 1600 (see FIG. 11 for interconnectivity). Fabricator 150 provides connectivity between the controller 1540 and the switches QA1, QB1, QA2, and QB2 in any suitable manner to convey respective signals 105.

Atop the switches in the switch layer 1610, the fabricator 150 further fabricates the power supply stack assembly 1600 to include one or more inductor devices as described herein. Additionally, via connectivity layer 1620, the fabricator 150 further connects the switches QA1, QB1, QA2, and QB2 to the one or more inductor devices 1531 (such as electrically conductive path 120-1), 1532 (such as electrically conductive path 120-2), etc.

More specifically, in this example embodiment, the fabricator 150 connects the source node (S) of switch QB1 to the ground reference node 1510-1 in the power interface 1601. Note that the ground reference node 1510-1 (such as ground reference return path connected to the dynamic load 118) extends from the substrate 1505 to the dynamic load 118 via L-shaped ground node 1510-1 (which is connected to the ground voltage reference). Additionally, or alternatively, as previously discussed, the cutaway portions filled with electrically conductive material also can be used to provide a return a path through the circuit component 110.

The fabricator 150 connects the drain node (D) of switch QB1 to node 1621 (such as fabricated from metal), which is electrically connected to the first end 141 of the inductive path 1531 (such as instantiation of electrically conductive path 120-1). Thus, via connectivity layer 1620, the fabricator 150 connects the drain node of the switch QB1 to the inductive path 1531.

The fabricator 150 connects the drain node (D) of switch QA1 to the voltage source node 1520 (which is electrically connected to the input voltage V1) of the first power interface 1601.

The fabricator 150 connects the source node (S) of switch QA1 to node 1621, which is electrically connected to the first end 141 of the inductive path 1531 (such as instantiation of electrically conductive path 120-1) as previously discussed. Thus, via connectivity layer 1620 and corresponding node 1621, the source node of the switch QA1 is connected to the inductive path 1531 of inductor device 110.

As further shown, the fabricator 150 connects the source node (S) of switch QB2 to the ground reference node 1510-2 in the power interface 1601. The ground reference node 1510-2 (current return path) extends from the substrate 1505 to the dynamic load 118 via L-shaped ground reference node 1510-2 (which is connected to the ground voltage reference). The fabricator 150 connects the drain node (D) of switch QB2 to node 1622 (such as fabricated from metal), which is electrically connected to the first end 141 of the inductive path 1532 (such as instantiation of electrically conductive path 131 or electrically conductive path 831). Thus, via connectivity layer 1620, the drain node of the switch QB2 is connected to the inductive path 1532 of inductor device 110.

Note that although each of the nodes 1510-1 and 1510-2 appear to be L-shaped from a side view of the power supply stack assembly 1600, in one embodiment, the node 1510 extends circumferentially about an outer surface of the power supply stack assembly 1600 (in a similar manner as electrically conductive path 133 as previously discussed). Additionally, or alternatively, as previously discussed, the cutaway portions of the circuit component 110 provide a way to convey voltages through the circuit component 110.

As further shown, the fabricator 150 connects the drain node (D) of switch QA2 to the voltage source node 1520 (which is connected to voltage V1) in the power interface 1601. The fabricator 150 connects the source node (S) of switch QA2 to node 1622, which is electrically connected to the first axial end 141 of the inductive path 1532 (instantiation of electrically conductive path 131 or electrically conductive path 831). Thus, via connectivity layer 1620 and corresponding node 1622, the source node of the switch QA2 is connected to the inductive path 1532 (such as electrically conductive path 120-2).

Accordingly, the fabricator 150 disposes the one or more switches (such as QA1, QB1, QA2, and QB2) in the power supply stack assembly 1600 between the first power interface 1601 and the inductor device 110.

In one non-limiting example embodiment, each of the one or more switches QA1, QB1, QA2, and QB2 in the power supply stack assembly 1600 is a vertical field effect transistor disposed between the first power interface 1601 and the inductor devices. However, additionally, or alternatively, note that one or more of switches QA1, QB1, QA2, and QB2 can be any suitable type of switches such as vertical or lateral field effect transistors, bipolar junction transistors, etc. It is also possible for lateral FETs, but vertical FETs are the ideal choice for this concept due to the flip chip method to minimize the current loop.

As previously discussed, the fabricator 150 fabricates the power supply stack assembly 1600 to include one or more inductor devices. In this example embodiment, the fabricator 150 disposes the multiple inductive paths 1531 (electrically conductive path 120-1) and inductive path 1532 (electrically conductive path 120-2) in the power supply stack assembly 1600 between the multiple switches QA1, QB1, QA2, and QB2 and the second power interface 1602.

In accordance with further embodiments, note that fabrication of the multiple inductive paths 1531 and 1532 includes: fabricating the multiple inductive paths to include a first inductive path 1531 (electrically conductive path 120-1) and a second inductive path 1532 (electrically conductive path 120-2) extending through core magnetic permeable material 161 of a respective inductor device 110 between the connectivity layer 1620 and the power interface 1602. In one embodiment, fabricator 150 fabricates each inductor device 1510 to include: i) core magnetic permeable material 161, the core magnetic permeable material being magnetic permeable ferromagnetic material, ii) an electrically conductive path 120-1 extending through the core material 161 from a first axial end of the electrically conductive path 120-1 to a second axial end 142 of the electrically conductive path 120-1.

Yet further in this example embodiment, the first inductive path 1531 is disposed in a first phase 221 (FIG. 11) of the power supply stack assembly 1600 (power converter circuit); the second inductive path 1532 is disposed in a second phase 222 (FIG. 11) of the power supply stack assembly 1600 (power converter circuit). During operation of the power converter (power supply stack assembly 1600), a combination of the first phase 221 and the second phase 222 disposed in parallel produce the output voltage 123. If desired, the controller 1540 can be fabricated into the power supply stack assembly 1600 as well.

In one embodiment, each of the one or more inductive paths 1531 (such as electrically conductive path 120-1) and 1532 (such as electrically conductive path 120-2) is a respective non-winding path extending from a first layer (such as switch layer 1610) in the stack including the multiple switches QA1, QB1, QA2, and QB2 to a second layer in the stack including the second power interface 1602.

Note that further embodiments herein include connecting multiple inductive paths in the inductor devices 1510 in parallel to increase an inductance of a respective inductive path. As described herein, any number of inductive paths can be connected in parallel to provide a desired overall inductance. Thus, in addition to controlling parameters such as permeability of the core material 161 of a respective circuit component 110, a respective length (between first end 141 and second end 142) of each non-winding electrically conductive path (such as straight or direct path) in the inductor device 110, embodiments herein also include connecting multiple inductive paths in parallel to control a magnitude of inductance provided by the respective inductor device 110. Also, as previously discussed, embodiments herein include fabricating the core material 161 in the inductor devices such that a magnitude of the magnetic permeability of the core varies with respect to a respective electrically conductive path providing connectivity between layer 1620 and 1602.

As further shown, the fabricator 150 disposes the inductor devices in the power supply stack assembly 1500 between the multiple switches (QA1, QB1, QA2, and QB2) in switch layer 1610 and the second power interface 1602.

More specifically, the fabricator 150 produces the power supply assembly 1600 to include a second power interface 1602. In one embodiment, the fabricator 150 connects the output axial end of the inductor devices (120-1 and 120-2) and corresponding nodes to the second power interface 1602. The second power interface 1602 is operable to receive the output voltage 123 produced by the inductor devices L1 (electrically conductive path 120-1) and L2 (electrically conductive path 120-2) and output it to the load 118. The fabricator 150 couples the output nodes of both the inductive path 1531 and inductive path 1532 to the output voltage node 1631 (such as a layer of material such as metal). Thus, the output voltage node 1631 is electrically connected to the output of the respective inductive paths 1531 and 1532.

As its name suggests, the output voltage node 1631 conveys the output voltage 123 to power the load 118.

In one embodiment, one or more nodes or pins, pads, etc., of the dynamic load 118 are coupled to the output voltage node 1631. For example, output voltage node 1631 of the power supply stack assembly 1500 conveys the output voltage 123 produced by each of the inductive paths 1531 and 1532 to the one or more nodes, pins, pads, etc., of the load 118.

Accordingly, via switching of the inductive paths between the ground voltage and the input voltage V1, the combination of inductive paths 1531 and 1532 collectively produces the output voltage 123 to power the load 118.

As previously discussed, power supply stack assembly 1600 further includes ground node 1510-1 and 1510-2. In one embodiment, the instantiation of electrically conductive path 1510-1 and 1510-2 (such as ground nodes) provide perimeter electromagnetic shielding with respect to power supply stack assembly 1600, preventing or reducing corresponding radiated emissions into the surrounding environment.

In yet further embodiments, the fabricator 150 fabricates the first power interface 1601 to include first contact elements operable to connect the first power interface 1601 at the base of the power supply stack assembly 1600 to a host substrate 1505. The fabricator 150 fabricates the second power interface 1602 to include second contact elements operable to affix a dynamic load 118 to the power supply stack assembly 1600.

Note that power supply stack assembly 1500 is fabricated to further include first capacitors 1521, 1522, etc., providing connectivity between the input voltage node 1520 (first electrically conductive path supplying input voltage V1 to the power supply stack assembly 1600) and ground nodes 1510-1 and 1510-2 (such as second electrically conductive path supplying the ground reference voltage to the power supply stack assembly 1600).

The fabricator 150 further disposes output voltage node 1631 (such as another electrically conductive path) in the layer of the power supply stack assembly 1602 including the second power interface 1602. As previously discussed, the output voltage node 1631 (such as layer of metal) is operable to convey the output voltage 123 to the dynamic load 118.

In accordance with further embodiments, the fabricator 150 fabricates the power supply stack assembly 1600 to include second capacitors (1691, 1692, etc.) connected between the output voltage node 1631 and a respective ground node 1510. More specifically, capacitor 1691 is coupled between output voltage node 1631 and the ground node 1510-1; capacitor 1692 is coupled between output voltage node 1631 and the ground node 1510-2.

Further embodiments herein include affixing a dynamic load 118 to the second power interface 1602. Accordingly, the dynamic load 118 is affixed atop the power supply stack assembly 1600.

The power supply stack assembly 1600 (assembly of components such as a vertical stack) as described herein provides advantages over conventional power converters. For example, the power supply stack assembly 1600 as described herein provides novel connectivity of components in an assembly (such as via stacking), resulting in shorter circuit paths and lower losses when converting and delivering power to the dynamic load 118.

As previously discussed with respect to FIG. 11, during operation, the inductor devices L1 and L2 and corresponding inductive paths 1531 and 1532 are operable to produce an output voltage 123 based on the received power (current supplied by input voltage, V1). In other words, the power supply stack assembly 1600 and corresponding fabricated stack of components (such as first power interface 1601, one or more switches QA1, QB1, QA2, and QB2, inductor device 110, second power interface 1602) is a power converter operable to convert an input voltage V1 (such as a DC voltage) received at the first power interface 1601 into the output voltage 123 (such as a DC voltage) outputted from the second power interface 1602 to the dynamic load 118.

Further embodiments herein include fabrication of the system. For example, embodiments herein include a fabricator 150. The fabricator 150 receives a substrate 1505 such as a circuit board; the fabricator 150 affixes a base (such as interface 1601) of the stack of components (such as a power supply stack assembly 1600) to the circuit board. As previously discussed, the stack of components (power supply stack assembly 1600) is operative to generate an output voltage 123 to power a load 118. The load 118 is either affixed to the circuit board or the load 118 is affixed atop the power supply stack assembly 1600.

Further, as previously discussed, the load 118 can be any suitable circuit such as CPUs (Central Processing Units), GPUs and ASICs (such those including one or more Artificial Intelligence Accelerators), which can be located on standalone circuit board.

Figure 13:
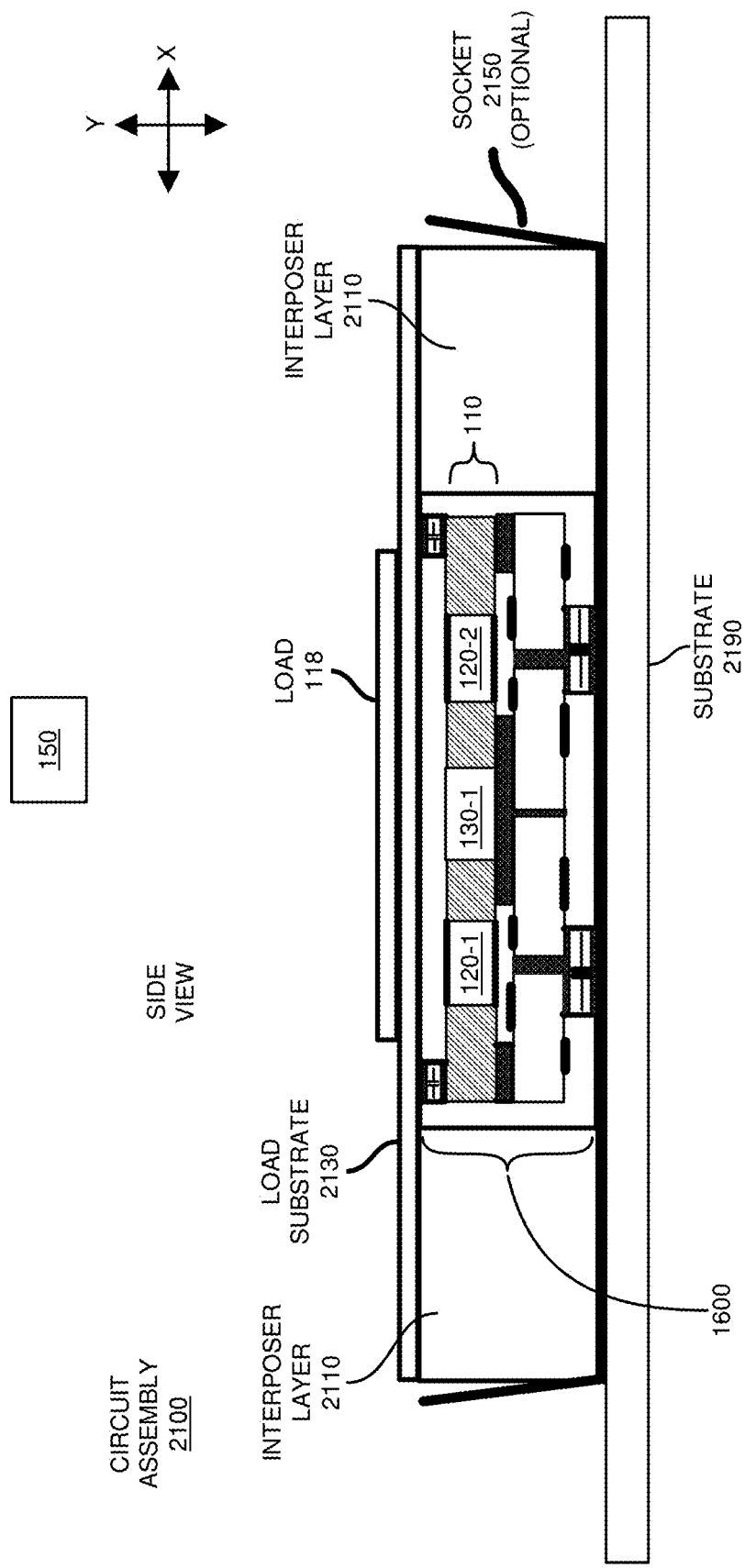
FIG. 13 is an example diagram illustrating a power supply circuit assembly including one or more inductor devices according to embodiments herein.

FIG. 13 is an example diagram illustrating a circuit assembly according to embodiments herein.

As shown in this example embodiment, circuit assembly 2100 includes power supply stack assembly 1600 disposed in an interposer layer 2110. The interposer layer 2110 provides circuit path connectivity between the substrate 2190 and the load substrate 2130 (and load 118).

In a manner as previously discussed, the power supply stack assembly (1600) receives an input voltage (and any other voltage reference signals such as ground, and/or V1, V2, etc.) from the substrate 2190. The power supply stack assembly (1600) converts the input voltage into an output voltage 123 (and/or output current) that powers the respective load 118 and/or other circuit components disposed on the load substrate 2130.

In one embodiment, the substrate 2190 is a Printed Circuit Board (PCB) substrate, although substrate 2190 can be any suitable component to which socket 2150 (optional) or interposer layer 2110 is connected. Via insertion into socket 2150, the interposer layer 2110 is in communication with the substrate 2190. In the absence of socket 2150, the interposer layer 2110 is connected directly to the substrate 2190.

Figure 14:
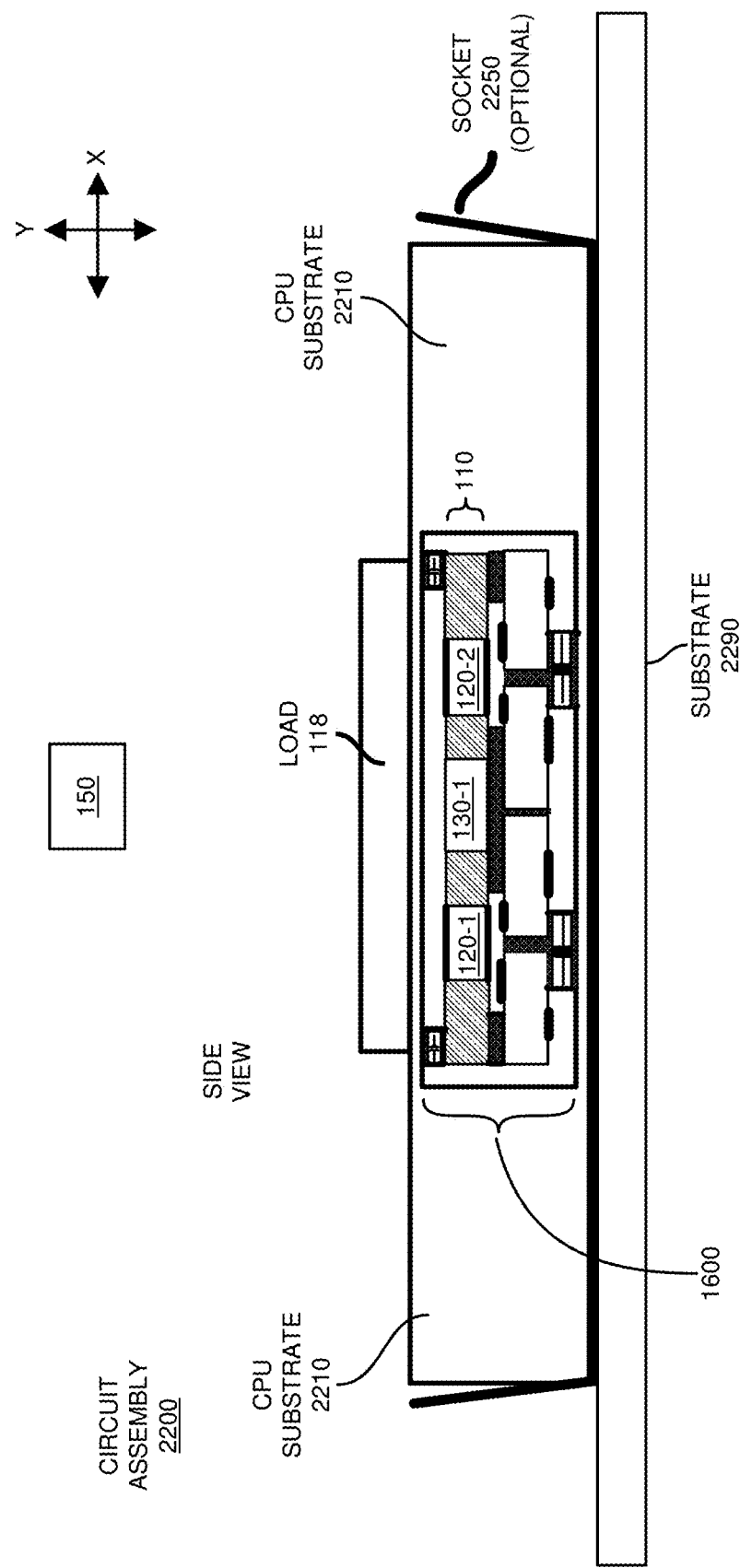
FIG. 14 is an example diagram illustrating a power supply circuit assembly including one or more inductor devices according to embodiments herein.

FIG. 14 is an example diagram illustrating a circuit assembly according to embodiments herein.

As shown in this example embodiment, circuit assembly 2200 includes power supply stack assembly 1600 disposed in a CPU (Central Processing Unit) substrate 2210. In one embodiment, the power supply stack assembly 1600 is integrated into the laminate portion of the CPU substrate 2210 itself. The CPU substrate 2210 provides circuit path connectivity between the substrate 2290 and the load 118 (and other components connected to the CPU substrate load 2120).

In a manner as previously discussed, the power supply stack assembly (1600) receives an input voltage (and any other voltage reference signals such as ground, and/or voltages V1, V2, etc.) from the substrate 2290. The power supply stack assembly (1600) converts the input voltage into an output voltage (and/or output current) that powers the respective load 118 and/or other circuit components disposed on the load CPU substrate 2210.

In one embodiment, the substrate 2290 is a Printed Circuit Board (PCB) substrate, although substrate 2290 can be any suitable component to which socket 2250 (optional) or CPU substrate 2210 is directly connected. Via insertion into socket 2250, the CPU substrate layer 2210 and power supply stack assembly is in communication with the substrate 2290. In the absence of socket 2250, the CPU substrate 2210 is connected directly to the substrate 2290.

Figure 15:
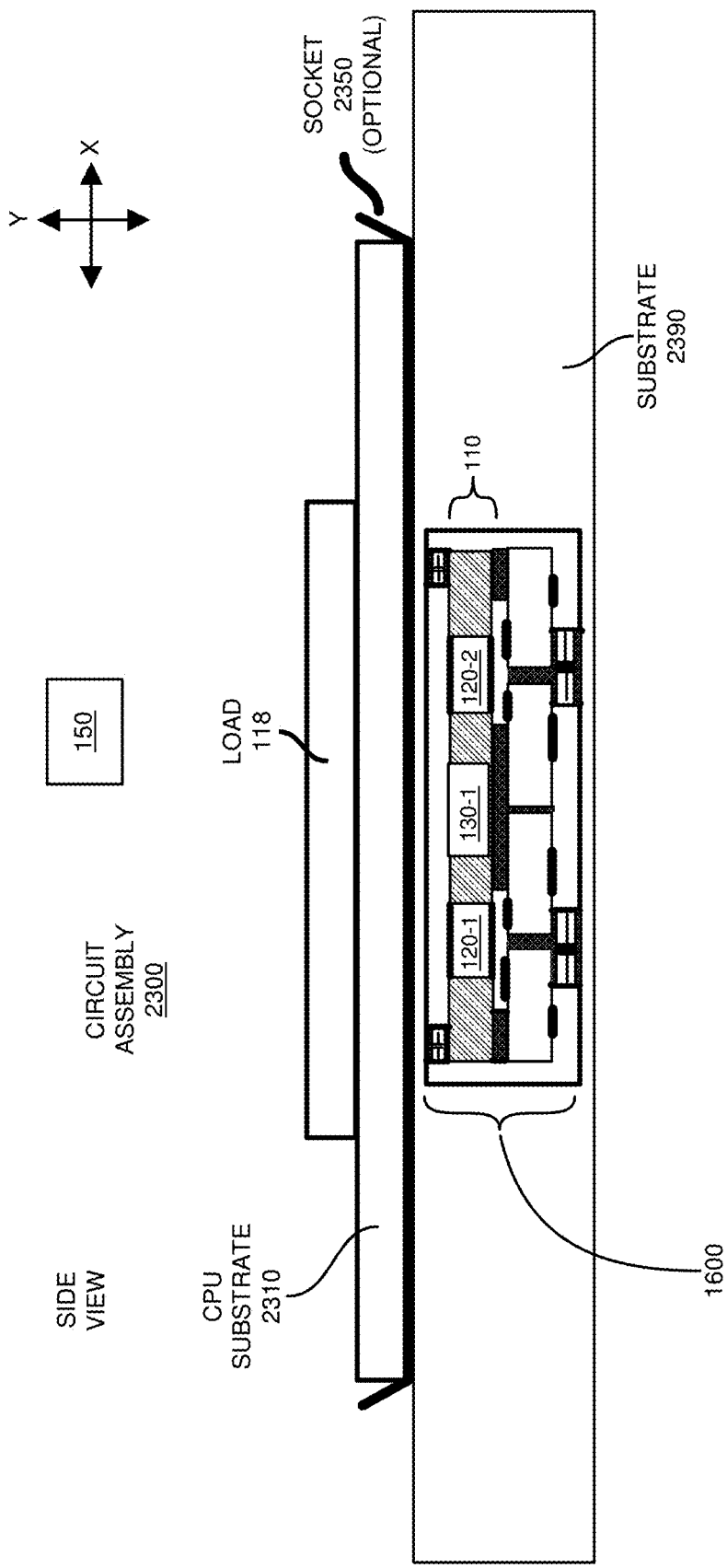
FIG. 15 is an example diagram illustrating a power supply circuit assembly including one or more inductor devices according to embodiments herein.

FIG. 15 is an example diagram illustrating a circuit assembly according to embodiments herein.

As shown in this example embodiment, circuit assembly 1900 includes power supply stack assembly 1600 disposed in substrate 2390 such as a circuit board (such as a printed circuit board).

In one embodiment, the power supply stack assembly 1600 is embedded or fabricated in an opening of the substrate 2390. In other words, in one embodiment, the power supply stack assembly 1600 (converter unit) is fabricated (inserted) into an opening below the CPU substrate 2310. The CPU substrate 2310 provides circuit path connectivity between the substrate 2390 and the load 128 (and/or other components connected to the CPU substrate load 1910).

In a manner as previously discussed, the power supply stack assembly (1600) receives an input voltage (and any other voltage reference signals such as ground, and/or V1, V2, etc.) from the substrate 2390. The power supply stack assembly (1600) converts the input voltage into an output voltage (and/or output current) that powers the respective load 118 and/or other circuit components disposed on the load CPU substrate 2310.

In one embodiment, the substrate 2390 is a Printed Circuit Board (PCB) substrate, although substrate 2390 can be any suitable component to which socket 2350 (optional) or CPU substrate 2310 is directly connected. In one embodiment, via insertion into socket 2350, the CPU substrate 2310 is in communication with the substrate 2390. In the absence of socket 2350, the CPU substrate 2310 is connected directly to the substrate 2390.

Figure 16:
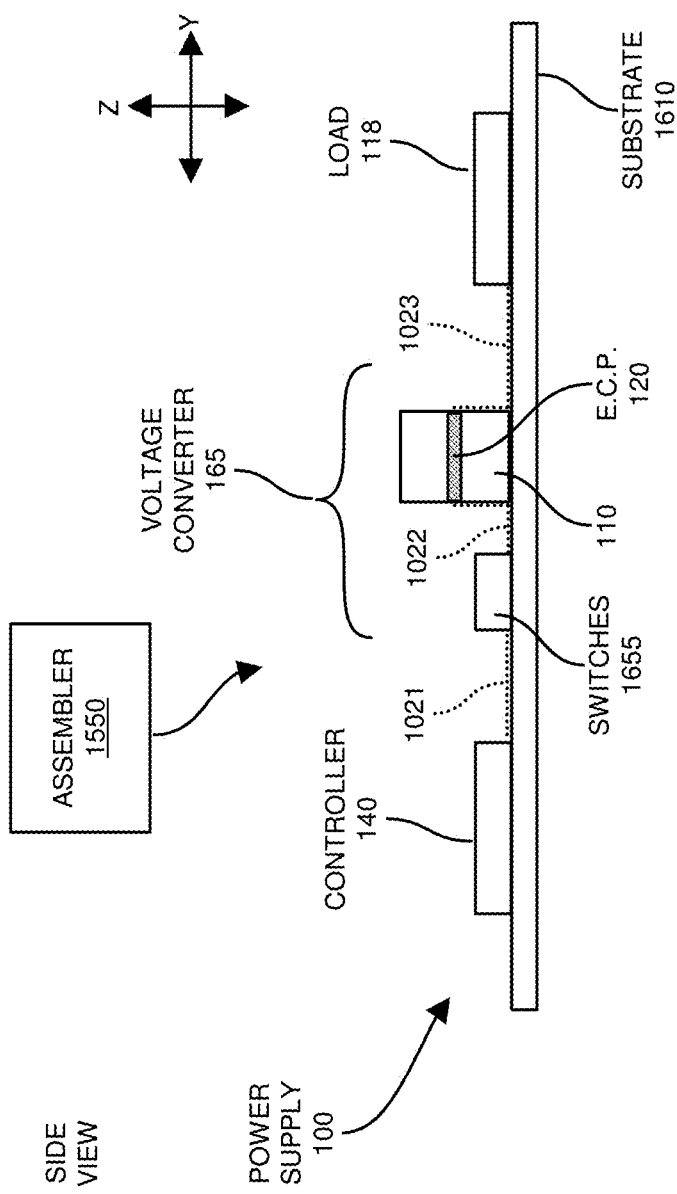
FIG. 16 is an example diagram illustrating implementation of a circuit assembly including an inductive circuit component according to embodiments herein.

FIG. 16 is an example diagram illustrating implementation of a circuit assembly including a circuit component according to embodiments herein.

In this example embodiment, assembler 1550 receives a substrate 1610 and corresponding components of power supply 100 to fabricate controller 140, switches 1655, circuit component 110, etc. The assembler 1550 affixes (couples) the controller 140 and other components associated with the power supply 100 to the substrate 1610.

Via respective circuit paths 1021, 1022, 1023, etc., as described herein, the assembler 1550 provides connectivity between the controller 140, switches 1655, circuit component 110, and load 118.

Note that components such as the controller 140, circuit component 110, and corresponding components can be affixed or coupled to the substrate 1610 in any suitable manner. For example, each of the one or more components in power supply 100 can be soldered to the substrate 1610, inserted into respective sockets disposed on the substrate 1610, etc.

Note further that the substrate 1610 is optional. Any of one or more circuit paths or connectivity as shown in the drawings and as described herein can be disposed in cables or other suitable medium.

In one nonlimiting example embodiment, the load 118 is disposed on its own substrate independent of substrate 1610; the substrate of the load 118 (such as substrate 1610 or other substrate) is directly or indirectly connected to the substrate 1610 via connectivity 1023 such as one or more of wires, cables, links, etc. The controller 140 or any portion of the power supply 100 and corresponding components can be disposed on a standalone smaller board plugged into a socket of the substrate 1610 as well.

Via one or more circuit paths 1023 (such as one or more traces, cables, connectors, wires, conductors, electrically conductive paths, etc.), the assembler 1550 couples the power supply 100 and corresponding components to the load 118. In one embodiment, the circuit path 1023 conveys the output voltage generated by the circuit component 110 and electrically connects the electrically conductive paths 120 the to the load 118. The electrically conductive paths produce an output voltage to power the load 118.

Accordingly, embodiments herein include a system comprising: a substrate 1610 (such as a circuit board, standalone board, mother board, standalone board destined to be coupled to a mother board, host, etc.); a power supply system 100 including corresponding components as described herein; and a load 118 (such as a motor, winding, etc.).

Note that the load 118 can be any suitable circuit or hardware such as one or more CPUs (Central Processing Units), GPUs (Graphics Processing Unit) and ASICs (Application Specific Integrated Circuits such those including one or more Artificial Intelligence Accelerators), which can be located on the substrate 1610 or disposed at a remote location.

Figure 17:
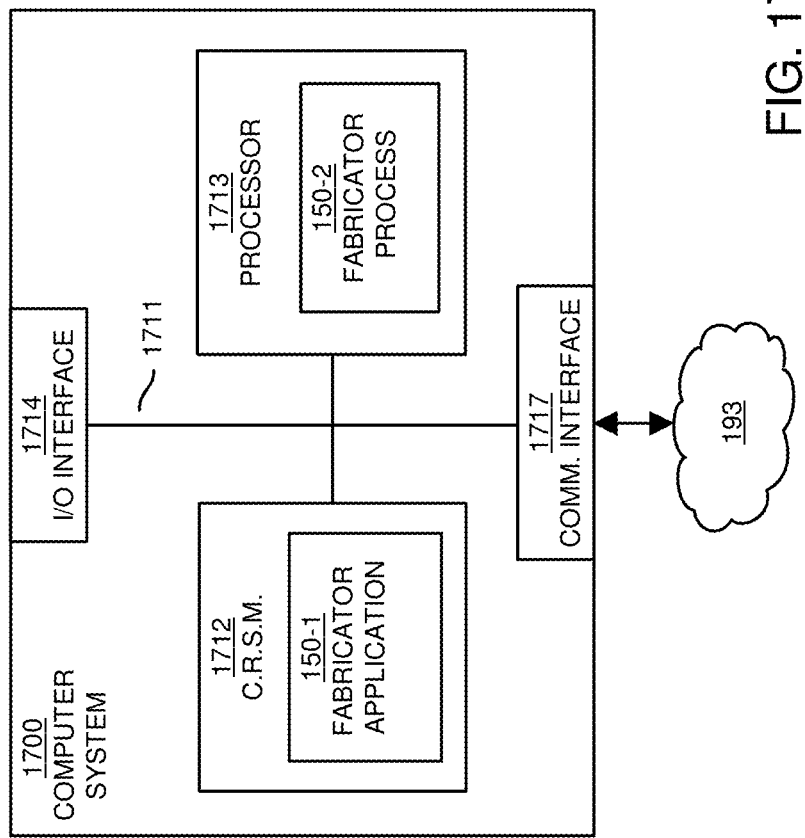
FIG. 17 is an example diagram illustrating example computer architecture (fabricator system, fabricator hardware, etc.) operable to execute one or more methods according to embodiments herein.

FIG. 17 is a diagram illustrating example computer architecture operable to execute one or more methods according to embodiments herein.

As previously discussed, any of the resources (such as fabricator 150, etc.) as discussed herein can be configured to include computer processor hardware and/or corresponding executable instructions to carry out the different operations as discussed herein.

As shown, computer system 1700 of the present example includes an interconnect 1711 that couples computer readable storage media 1712 such as a non-transitory type of media (which can be any suitable type of hardware storage medium in which digital information can be stored and retrieved), a processor 1713 (computer processor hardware), I/O interface 1714, and a communications interface 1717.

I/O interface(s) 1714 supports connectivity to external hardware such as a keyboard, display screen, repository, fabrication equipment, etc.

Computer readable storage medium 1712 can be any hardware storage device such as memory, optical storage, hard drive, floppy disk, etc. In one embodiment, the computer readable storage medium 1712 stores instructions and/or data.

As shown, computer readable storage media 1712 can be encoded with fabricator application 150-1 (e.g., including instructions) to carry out any of the operations as discussed herein.

During operation of one embodiment, processor 1713 accesses computer readable storage media 1712 via the use of interconnect 1711 in order to launch, run, execute, interpret or otherwise perform the instructions in fabricator application 150-1 stored on computer readable storage medium 1712. Execution of the fabricator application 150-1 produces fabricator process 150-2 to carry out any of the operations and/or processes as discussed herein.

Those skilled in the art will understand that the computer system 1700 can include other processes and/or software and hardware components, such as an operating system that controls allocation and use of hardware resources to execute fabricator application 150-1.

In accordance with different embodiments, note that computer system may reside in any of various types of devices, including, but not limited to, a power supply, switched-capacitor converter, power converter, a mobile computer, a personal computer system, a wireless device, a wireless access point, a base station, phone device, desktop computer, laptop, notebook, netbook computer, mainframe computer system, handheld computer, workstation, network computer, application server, storage device, a consumer electronics device such as a camera, camcorder, set top box, mobile device, video game console, handheld video game device, a peripheral device such as a switch, modem, router, set-top box, content management device, handheld remote control device, any type of computing or electronic device, etc. The computer system 1700 may reside at any location or can be included in any suitable resource in any network environment to implement functionality as discussed herein.

Figure 18:
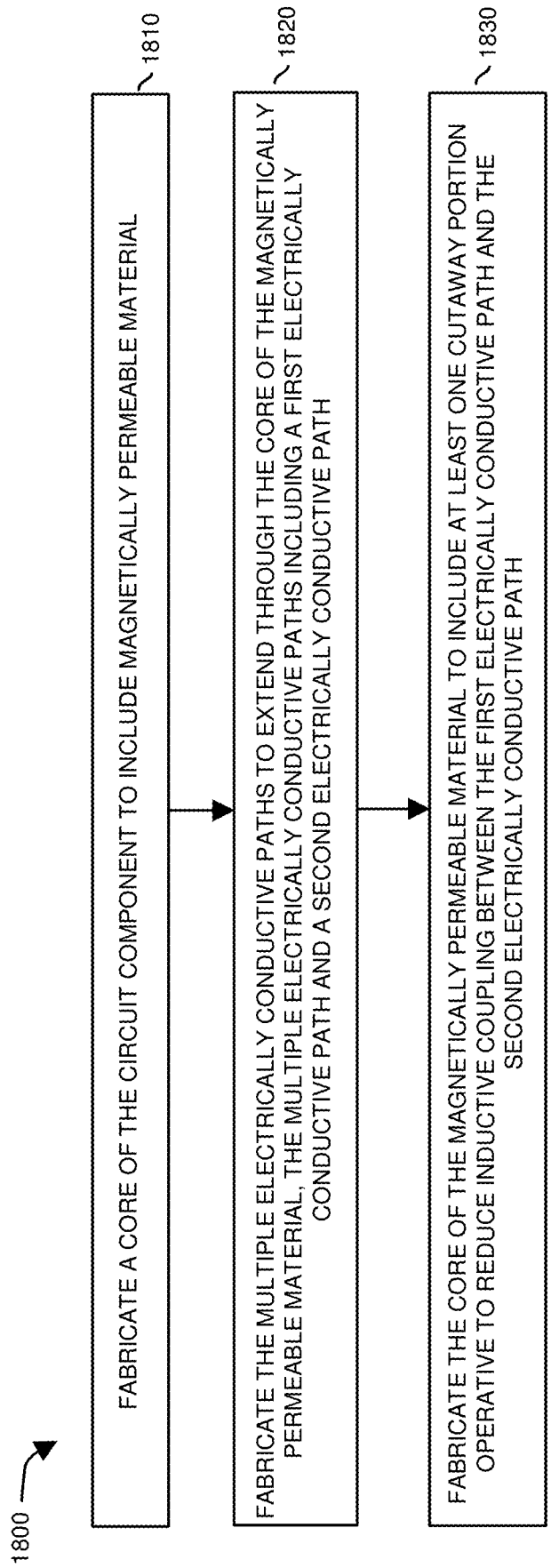
FIG. 18 is an example diagram illustrating a method according to embodiments herein.

Functionality supported by one or more resources as described herein are discussed via flowchart in FIG. 18. Note that the steps in the flowcharts below can be executed in any suitable order.

FIG. 18 is a flowchart 1800 illustrating an example method according to embodiments herein. Note that there will be some overlap with respect to concepts as discussed above.

In processing operation 1810, the fabricator 150 fabricates a core of the circuit component 110 to include magnetic permeable material 161.

In processing operation 1820, the fabricator 150 fabricates the multiple electrically conductive paths 120 to extend through the core of the magnetic permeable material 161. The multiple electrically conductive paths 120 include a first electrically conductive path 120-1 and a second electrically conductive path 120-1.

In processing operation 1830, the fabricator 150 fabricates the core of the magnetic permeable material 161 to include one or more cutaway portions 130 that are operative to reduce inductive coupling between the first electrically conductive path 120-1 and the second electrically conductive path 120-2.

Note again that techniques herein are well suited for use in fabrication of inductor devices and corresponding implementation in power converter applications. However, it should be noted that embodiments herein are not limited to use in such applications and that the techniques discussed herein are well suited for other applications as well.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

The invention claimed is:

1. An apparatus comprising:
a core, the core being a single element of magnetic permeable material;
an arrangement of multiple electrically conductive paths extending through the single element of magnetic permeable material, the multiple electrically conductive paths including a first electrically conductive path and a second electrically conductive path;
the single element of magnetic permeable material fabricated to include at least one cutaway portion operative to reduce inductive coupling between the first electrically conductive path and the second electrically conductive path;
wherein the single element of magnetic permeable material includes a top surface. a bottom surface. a first side surface. and a second side surface; and
wherein the at least one cutaway portion includes a first cutaway portion disposed along the top surface between the first side surface and the second side surface.

2. The apparatus as in claim 1, wherein the at least one cutaway portion includes the first cutaway portion and a second cutaway portion, the single element of magnetic permeable material being absent from both the first cutaway portion and the second cutaway portion, the second cutaway portion residing on the single element of magnetic permeable material opposite the first cutaway portion.

3. The apparatus as in claim 1, wherein the at least one cutaway portion includes the first cutaway portion and a second cutaway portion; and
wherein the single element of magnetic permeable material includes a magnetically permeable material portion disposed between the first electrically conductive path and the second electrically conductive path.

4. The apparatus as in claim 3, wherein the magnetically permeable material portion of the single element of magnetic permeable material is also disposed between the first cutaway portion and the second cutaway portion.

5. The apparatus device as in claim 1, wherein the at least one cutaway portion includes the first cutaway portion and a second cutaway portion, the second cutaway portion disposed on the single element of magnetic permeable material opposite the first cutaway portion; and
wherein the first electrically conductive path and the second electrically conductive path are disposed in parallel to each other and extend from a first surface of the single element of magnetic permeable material to a second surface of the single element of magnetic permeable material.

6. The apparatus as in claim 1, wherein a magnitude of reduced inductor coupling between the first electrically conductive path and the second electrically conductive path is dependent on a size of the at least one cutaway portion.

7. The apparatus as in claim 1, wherein the first cutaway portion is disposed in both: i) a first flux path associated with flow of first current through the first electrically conductive path, and ii) a second flux path associated with flow of second current through the second electrically conductive path.

8. The apparatus as in claim 1 further comprising:
a first cell in which the first electrically conductive path resides, the first cell defined at least in part by the at least one cutaway portion; and
a second cell in which the second electrically conductive path resides, the second cell defined at least in part by the at least one cutaway portion.

9. The apparatus as in claim 1, wherein the multiple electrically conductive paths include N electrically conductive paths, wherein N is greater than 2.

10. A system comprising:
a circuit board;
the apparatus of claim 1, the apparatus disposed in a power converter affixed to the circuit board, the power converter operative to convert an input voltage into an output voltage.

11. A circuit comprising:
a substrate;
the apparatus of claim 1 disposed in a voltage regulator circuit coupled to the substrate.

12. A method comprising:
receiving the apparatus of claim 1; and
disposing the apparatus in a power converter affixed to a circuit board, the power converter operative to convert an input voltage into an output voltage.

13. The apparatus as in claim 1, wherein the core includes a first void and a second void;
wherein the first electrically conductive path resides in the first void; and
wherein the second electrically conductive path resides in the second void.

14. The apparatus as in claim 13, wherein each of the first electrically conductive path and the second electrically conductive path is enveloped with a respective layer of insulation material.

15. The apparatus as in claim 1, wherein each of the first electrically conductive path and the second electrically conductive path is enveloped with a respective layer of insulation material.

16. The apparatus as in claim 1, wherein the at least one cutaway portion includes a second cutaway portion disposed along the bottom surface between the first side surface and the second side surface; and
wherein the second cutaway portion is disposed opposite the first cutaway portion.

17. The apparatus as in claim 16, wherein the at least one cutaway portion includes a third cutaway portion disposed on the first side surface, the third cutaway portion disposed in parallel with the first electrically conductive path and the second electrically conductive path;
wherein the at least one cutaway portion includes a fourth cutaway portion disposed on the second side surface, the fourth cutaway portion disposed in parallel with the first electrically conductive path and the second electrically conductive path; and
wherein the fourth cutaway portion is disposed opposite the third cutaway portion.

18. The apparatus as in claim 1, wherein the first cutaway portion extends axially along a first axis;
   wherein the first electrically conductive path extends axially along a second axis;
   wherein the second electrically conductive path extends axially along the second axis: and
   wherein the first axis is orthogonal to the second axis.

19. The apparatus as in claim 18, wherein the at least one cutaway portion includes a second cutaway portion disposed in the bottom surface between the first side surface and the second side surface.

20. The apparatus as in claim 19, wherein the at least one cutaway portion includes a third cutaway portion disposed on the first side surface and a fourth cutaway portion disposed on the second side surface; and
   wherein a combination of the first cutaway portion, the second cutaway portion, the third cutaway portion, and the fourth cutaway portion, reside within a plane parallel to the first electrically conductive path and the second electrically conductive path.

21. The apparatus as in claim 1 further comprising:
   a first cell in which the first electrically conductive path resides, the first cell disposed in a first portion of the single element of magnetic permeable material;
   a second cell in which the second electrically conductive path resides, the second cell disposed in a second portion of the single element of magnetic permeable material; and
   wherein a third portion of the single element of magnetic permeable material is disposed between the first cell and the second cell.

22. The apparatus as in claim 1 further comprising:
   a multi-layer circuit assembly comprising:
      a first layer including multiple switches;
      a second layer including the single element of magnetic permeable material; and
      a third layer including a power interface operative to convey an output voltage supplied from the first electrically conductive path and the second electrically conductive path to a load.

23. The apparatus as in claim 22, wherein the multiple switches are operative to receive an input voltage; and
   wherein a combination of the first layer and the second layer in the multi-layer circuit assembly is operative to convert the input voltage into the output voltage.

24. An apparatus comprising:
   a core, the core being a single element of magnetic permeable material;
   an arrangement of multiple electrically conductive paths extending through the single element of magnetic permeable material, the multiple electrically conductive paths including a first electrically conductive path and a second electrically conductive path:
   the single element of magnetic permeable material fabricated to include at least one cutaway portion operative to reduce inductive coupling between the first electrically conductive path and the second electrically conductive path;
   a first cell in which the first electrically conductive path resides, the first cell disposed in a first portion of the single element of magnetic permeable material:
   a second cell in which the second electrically conductive path resides, the second cell disposed in a second portion of the single element of magnetic permeable material:
   wherein a third portion of the single element of magnetic permeable material is disposed between the first cell and the second cell;
   wherein the single element of magnetic permeable material includes a top surface, a bottom surface, a first side surface, and a second side surface; and
   wherein the at least one cutaway portion includes a first cutaway portion disposed in the top surface between the first side surface and the second side surface.

25. The apparatus as in claim 24, wherein the at least one cutaway portion includes a second cutaway portion disposed in the bottom surface between the first side surface and the second side surface; and
   wherein the second cutaway portion is disposed opposite the first cutaway portion.

26. The apparatus as in claim 25, wherein the at least one cutaway portion includes a third cutaway portion disposed on the first side surface;
   wherein the at least one cutaway portion includes a fourth cutaway portion disposed on the second side surface; and
   wherein the fourth cutaway portion is disposed opposite the third cutaway portion.

* * * * *